(12) United States Patent
Harada

(10) Patent No.: US 12,408,513 B2
(45) Date of Patent: Sep. 2, 2025

(54) OLED WITH CAPACITOR ELECTRODE ON BANK

(71) Applicant: Magnolia White Corporation, Tokyo (JP)

(72) Inventor: Kenji Harada, Tokyo (JP)

(73) Assignee: Magnolia White Corporation, Tokyo (JP)

(*) Notice: Subject to any disclaimer, the term of this patent is extended or adjusted under 35 U.S.C. 154(b) by 597 days.

(21) Appl. No.: 17/668,473

(22) Filed: Feb. 10, 2022

(65) Prior Publication Data

US 2022/0271115 A1 Aug. 25, 2022

(30) Foreign Application Priority Data

Feb. 12, 2021 (JP) ................................ 2021-020759

(51) Int. Cl.
*H01L 27/32* (2006.01)
*H10K 59/122* (2023.01)
*H10K 59/131* (2023.01)
*H10K 59/80* (2023.01)

(52) U.S. Cl.
CPC ....... *H10K 59/122* (2023.02); *H10K 59/1315* (2023.02); *H10K 59/80522* (2023.02)

(58) Field of Classification Search
CPC ................................................. H10K 59/1315
See application file for complete search history.

(56) References Cited

U.S. PATENT DOCUMENTS

| 2005/0146279 | A1 | 7/2005 | Hector et al. |
| 2005/0236629 | A1 | 10/2005 | Lee et al. |
| 2006/0208977 | A1* | 9/2006 | Kimura ................ G09G 3/2014 345/76 |
| 2012/0175645 | A1* | 7/2012 | Omoto ................. G09G 3/3233 257/40 |
| 2015/0179718 | A1 | 6/2015 | Kim et al. |
| 2016/0268361 | A1* | 9/2016 | Wang ................. H10K 59/1216 |

(Continued)

FOREIGN PATENT DOCUMENTS

| CN | 109216575 A | 1/2019 |
| JP | 2008-135325 A | 6/2008 |

(Continued)

OTHER PUBLICATIONS

Office Action issued on Nov. 15, 2022, in corresponding Indian Application No. 202214006519, 5 pages.

(Continued)

*Primary Examiner* — Peter Bradford
(74) *Attorney, Agent, or Firm* — Maier & Maier, PLLC

(57) ABSTRACT

According to one embodiment, a display device including a first lower electrode, a second lower electrode, a first wiring that is disposed between the first lower electrode and the second lower electrode, a second insulation layer that is disposed on the first wiring, a first organic layer that is disposed on the first lower electrode, a second organic layer that is disposed on the second lower electrode, a first upper electrode that is disposed on the first organic layer, a second upper electrode that is disposed on the second organic layer, and a second wiring that is disposed on the second insulation layer, opposed to the first wiring, and forms a capacitance between the first wiring and the second wiring.

10 Claims, 14 Drawing Sheets

(56) References Cited

U.S. PATENT DOCUMENTS

| | | | |
|---|---|---|---|
| 2016/0315133 A1* | 10/2016 | Sato | .................... H10K 50/828 |
| 2018/0033847 A1* | 2/2018 | Kim | .................. H10K 59/1216 |
| 2019/0229172 A1* | 7/2019 | Liu | ....................... H10K 71/00 |
| 2020/0365776 A1* | 11/2020 | Sim | ......................... H01L 33/54 |
| 2021/0296425 A1 | 9/2021 | Ochi et al. | |
| 2023/0180506 A1* | 6/2023 | Lee | .................... H10K 59/122 |
| | | | 257/40 |
| 2023/0200128 A1* | 6/2023 | Su | ........................ H10K 71/00 |
| | | | 257/40 |

FOREIGN PATENT DOCUMENTS

| | | | |
|---|---|---|---|
| KR | 1020050098596 A | | 10/2005 |
| KR | 1020150067974 A | | 6/2015 |
| KR | 1020170075865 A | | 7/2017 |
| WO | WO 2020/079805 A1 | | 4/2020 |

OTHER PUBLICATIONS

Office Action issued on May 7, 2024, in corresponding Chinese Application No. 202210123749.X, 13 pages.
Office Action issued on Sep. 3, 2024, in corresponding Japanese Application No. 2021-020759, 8 pages.
Office Action issued on Mar. 17, 2025, in corresponding German Application No. 10 2022 201 358.1, 30 pages.

\* cited by examiner

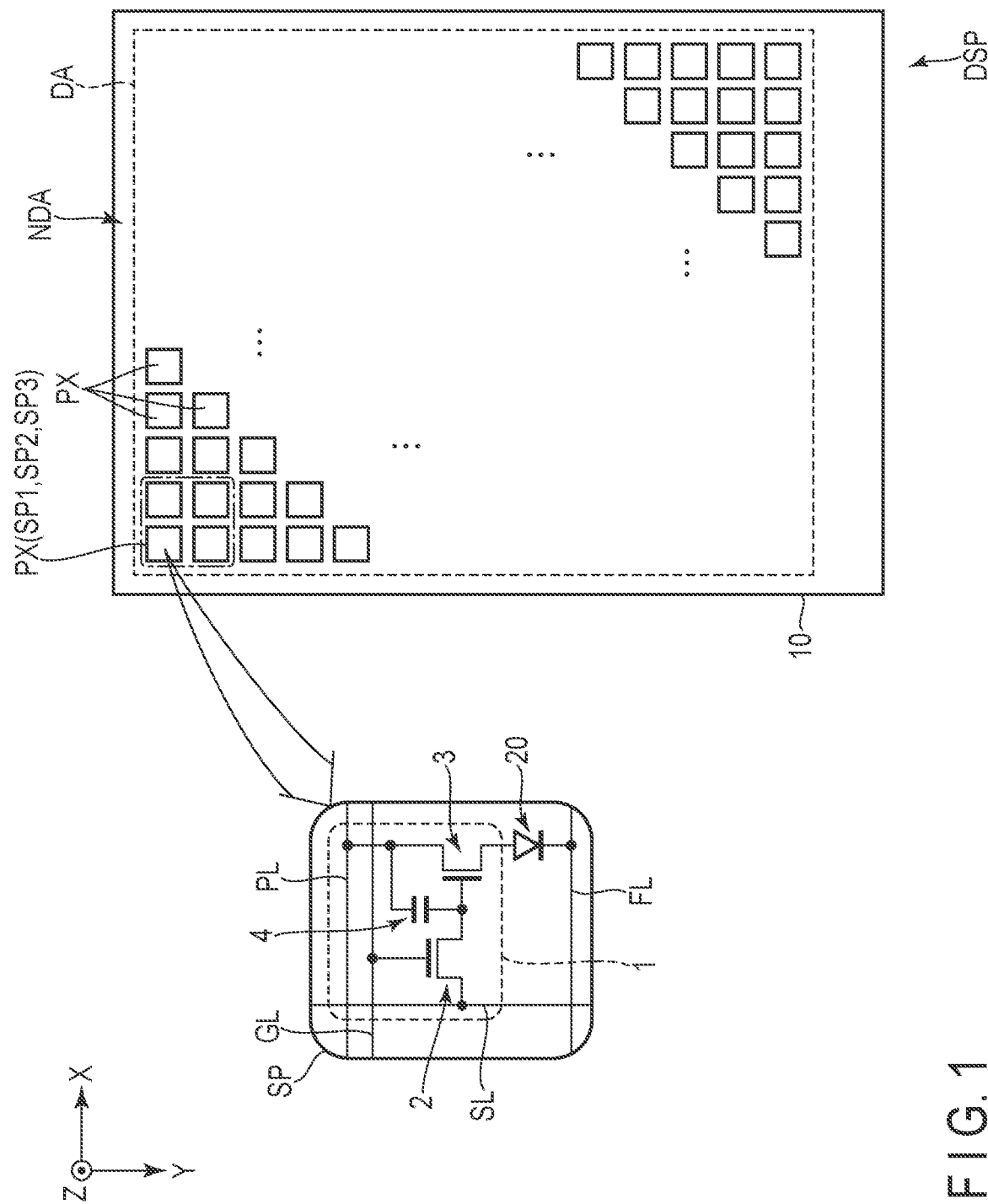
F I G. 1

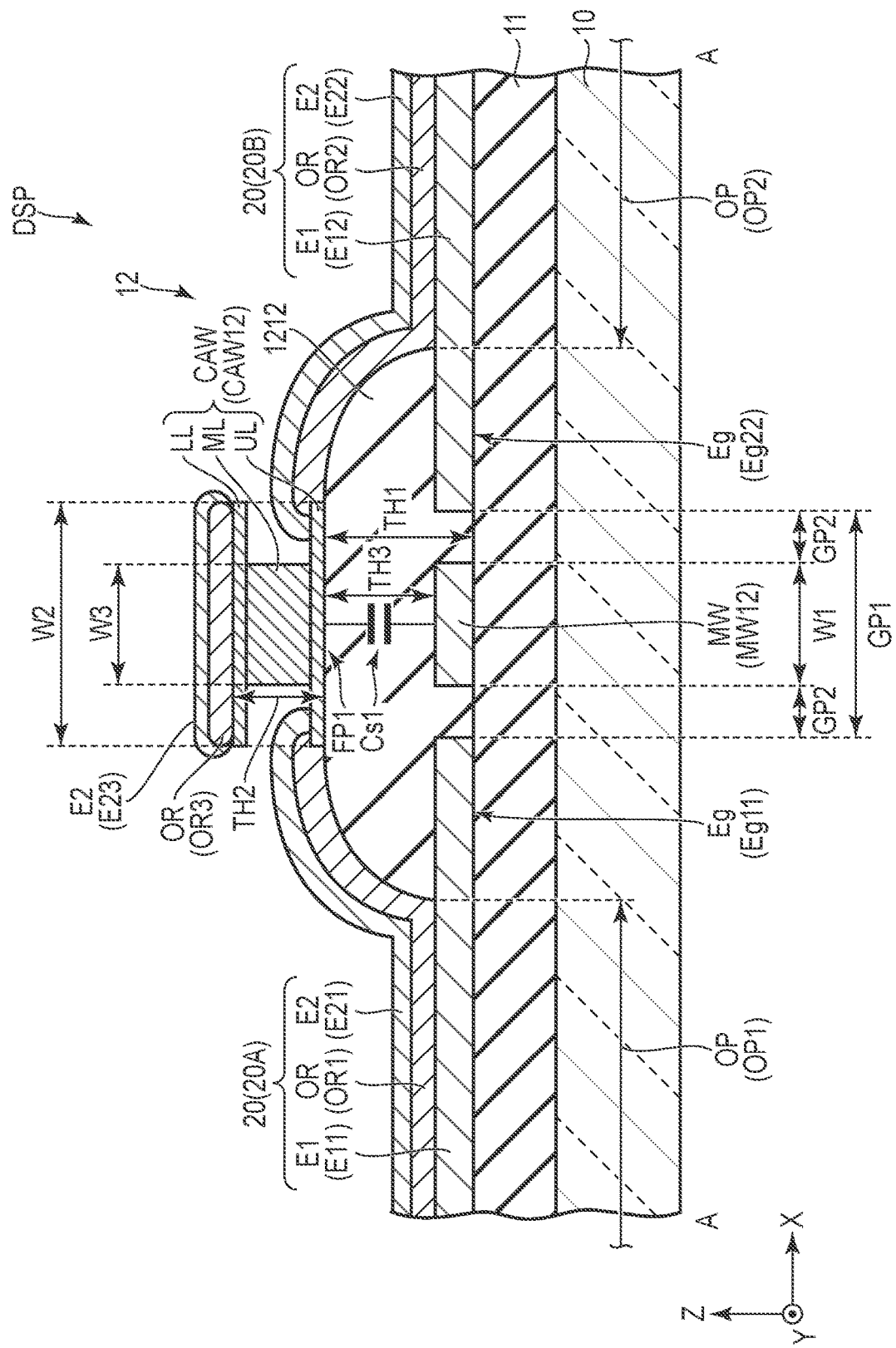
F I G. 4

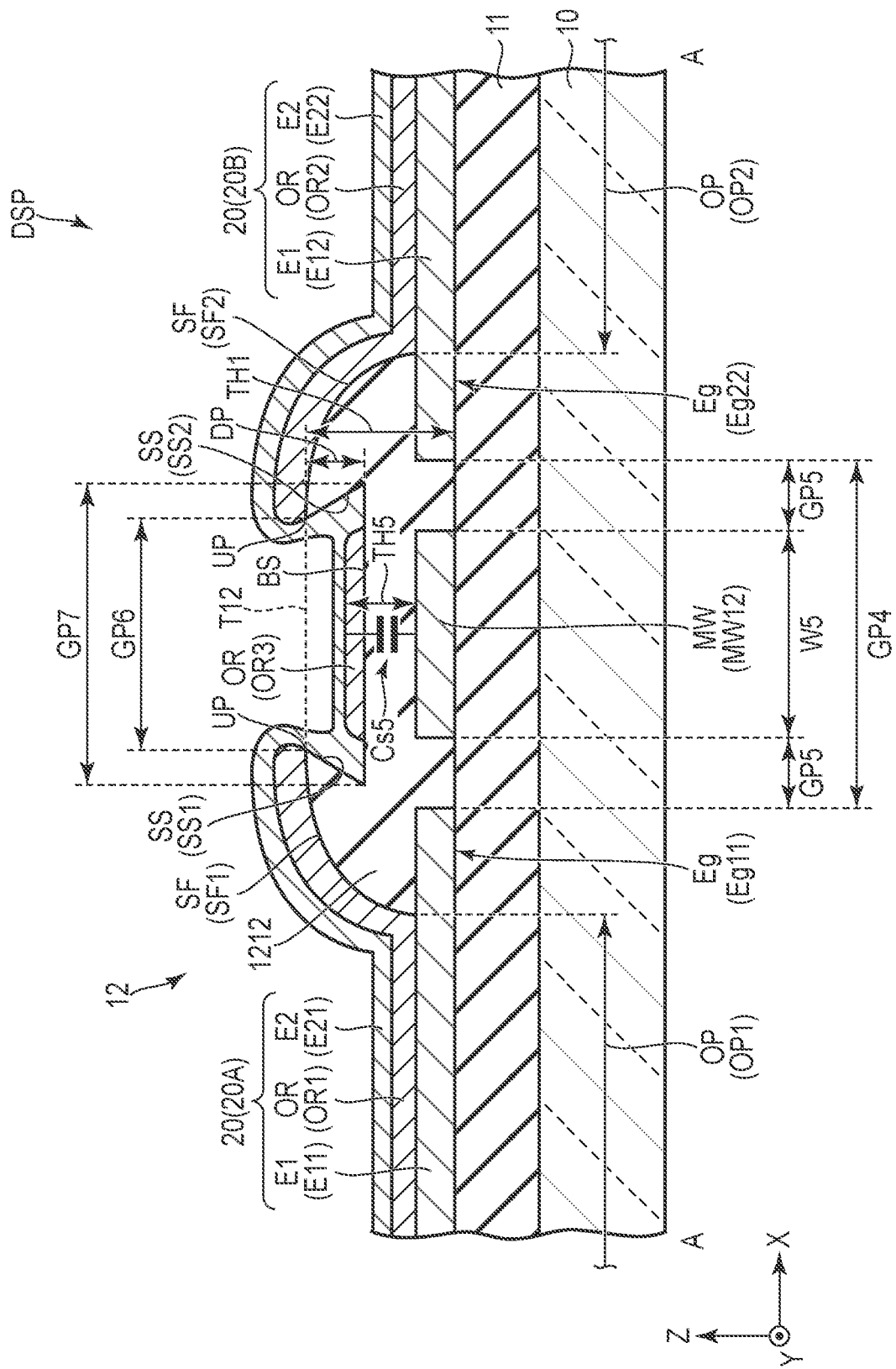
F I G. 8

US 12,408,513 B2

OLED WITH CAPACITOR ELECTRODE ON BANK

CROSS-REFERENCE TO RELATED APPLICATIONS

This application is based upon and claims the benefit of priority from Japanese Patent Application No. 2021-020759, filed Feb. 12, 2021, the entire contents of which are incorporated herein by reference.

FIELD

Embodiments described herein relate generally to a display device.

BACKGROUND

In recent years, a display device to which an organic light emitting diode (OLED) is applied as a display element has been put into practical use. The display element includes an organic layer between a pixel electrode and a common electrode. The organic layer includes a functional layer such as a hole transport layer or an electron transport layer in addition to a light emitting layer. Such an organic layer is formed, for example, by a vacuum deposition method.

In an ultra-high definition panel used for Virtual Reality (VR), an area per pixel is very small. In the ultra-high definition panel, since a driver circuit driving a pixel gate line is also disposed at the same pitch as a pixel pitch, an area per stage of the driver circuit is also very small. In a pixel circuit or the driver circuit, a capacitor may be formed in each circuit for operation, but in the ultra-high definition panel, it is difficult to accommodate a large capacitance capacitor within the pixel pitch. In a case where a metal layer, an insulation layer, and the like are multi-layered in order to increase capacitance in a small area, processes may be complicated and cost may be increased. In a case where a frame is enlarged in order to secure the area and increase the capacitance, a commercial value of the panel may decrease.

BRIEF DESCRIPTION OF THE DRAWINGS

FIG. 1 is a diagram illustrating a configuration example of a display device according to an embodiment.

FIG. 4 is a cross-sectional view illustrating a configuration example of a display device taken along line A-A shown in FIG. 3.

FIG. 8 is a cross-sectional view illustrating a configuration example of a display device according to a fourth modified example.

DETAILED DESCRIPTION

Figure 2:
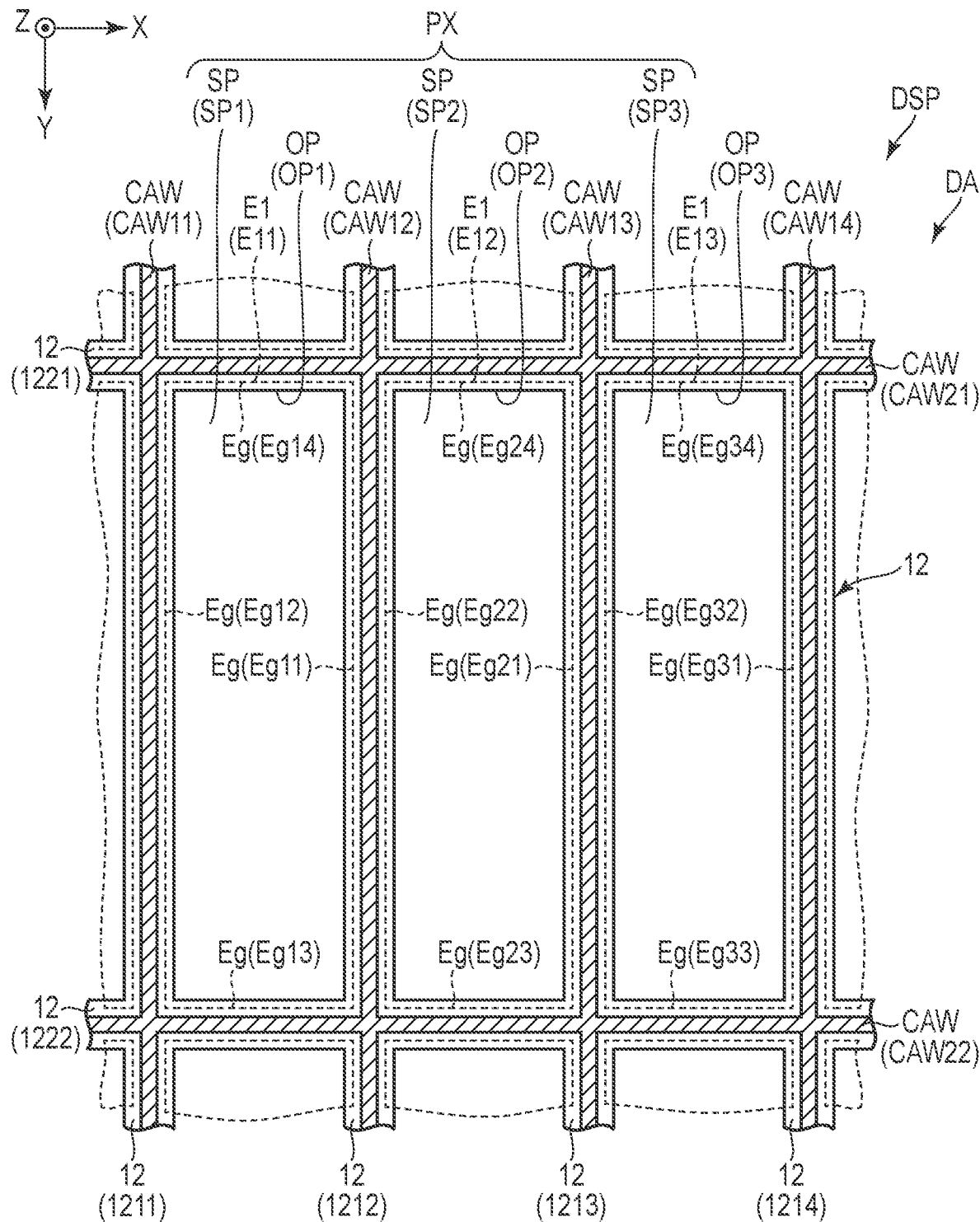
FIG. 2 is a plan view illustrating a configuration example of a pixel according to an embodiment.

In general, according to one embodiment, a display device comprising: a base; a first insulation layer that is disposed on the base; a first lower electrode that is disposed on the first insulation layer; a second lower electrode that is disposed on the first insulation layer, separated from the first lower electrode, and formed of a same material as that of the first lower electrode; a first wiring that is disposed between the first lower electrode and the second lower electrode; a second insulation layer that is disposed on the first wiring; a first organic layer that is disposed on the first lower electrode and includes a light emitting layer; a second organic layer that is disposed on the second lower electrode and includes the light emitting layer; a first upper electrode that is disposed on the first organic layer; a second upper electrode that is disposed on the second organic layer; and a second wiring that is disposed on the second insulation layer, opposed to the first wiring, and forms a capacitance between the first wiring and the second wiring.

According to another embodiment, a display device comprising: a base; a first insulation layer that is disposed on the base; a first lower electrode that is disposed on the first insulation layer; a second lower electrode that is disposed on the first insulation layer and separated from the first lower electrode; a first wiring that is disposed between the first lower electrode and the second lower electrode; a second insulation layer that is disposed on the first wiring, and includes a first opening portion overlapping the first lower electrode, a second opening portion overlapping the second lower electrode, a trench located between the first lower electrode and the second lower electrode, a first surface between the first opening portion and the trench, and a second surface between the first opening portion and the trench; a first organic layer that is disposed from the first lower electrode to the first surface and includes a light emitting layer; a second organic layer that is disposed from the second lower electrode to the second surface and includes the light emitting layer; a third organic layer that is disposed in the trench, separated from the first organic layer and the second organic layer, and includes the light emitting layer; and an upper electrode that covers the first organic layer, the second organic layer and the third organic layer, and forms a capacitance between the first wiring and the upper electrode, wherein the trench includes a bottom surface, a first side surface rising from the bottom surface and connected to the first surface, and a second side surface rising from the bottom surface and connected to the second surface, a first distance between the first side surface and the second side surface on an upper side of the trench is smaller than a second distance between the first side surface and the second side surface on a bottom surface side of the trench, and the third organic layer is disposed on the bottom surface.

According to another embodiment, a display device comprising: a base; a first insulation layer that is disposed on the base; a first lower electrode that is disposed on the first insulation layer; a second lower electrode that is disposed on the first insulation layer and separated from the first lower electrode; a first wiring that is disposed between the first lower electrode and the second lower electrode; a second insulation layer that is disposed on the first wiring, and includes a first opening portion overlapping the first lower electrode, a second opening portion overlapping the second lower electrode, a trench located between the first lower electrode and the second lower electrode, a first surface between the first opening portion and the trench, and a second surface between the first opening portion and the trench; a second wiring that is disposed in the trench, opposed to the first wiring, and forms a capacitance between the first wiring and the second wiring; a first organic layer that is disposed from the first lower electrode to the first surface and includes a light emitting layer; a second organic layer that is disposed from the second lower electrode to the second surface and includes the light emitting layer; a third organic layer that covers the second wiring in the trench, is separated from the first organic layer and the second organic layer, and includes the light emitting layer; and an upper electrode that covers the first organic layer, the second organic layer and the third organic layer, wherein the trench includes a bottom surface, a first side surface rising from the bottom surface and connected to the first surface, and a second side surface rising from the bottom surface and connected to the second surface, a first distance between the first side surface and the second side surface on an upper side of the trench is smaller than a second distance between the first side surface and the second side surface on a bottom surface side of the trench, and the second wiring is disposed on the bottom surface.

Hereinafter, the embodiment of the present invention will be described with reference to the drawings.

The disclosure is merely an example, and the matters that can be easily conceived of being appropriately changed by those skilled in the art while maintaining the gist of the invention are included in the scope of the present invention as a matter of course. In order to more clarify the description, width, thickness, a shape, and the like may be schematically expressed as compared with an actual form, but these are merely examples, and do not limit the interpretation of the present invention. In the present specification and the drawings, constituent elements exhibiting the same or similar functions for the above-mentioned drawings may be denoted by the same reference numerals, and the overlapping detailed description may be appropriately omitted.

In the drawings, an X axis, a Y axis, and a Z axis, which are orthogonal to each other, are described for easy understanding as necessary. A direction along the X axis is referred to as an X direction or a first direction X, a direction along the Y axis is referred to as a Y direction or a second direction Y, and a direction along the Z axis is referred to as a Z direction or a third direction Z. The first direction X, the second direction Y, and the third direction Z may intersect at an angle other than 90 degrees. A length of the first direction X and a length of the second direction Y may be referred to as a width, and a length of the third direction Z may be referred to as a thickness. In the present specification, a direction from a base 10 toward a display element 20 is referred to as "upper side" (or simply upper), and a direction from the display element 20 toward the base 10 is referred to as "lower side" (or simply lower). In a case of a "second layer on a first layer" and the "second layer under the first layer", the second layer may be in contact with the first layer or may be separated from the first layer. A plane defined by the X-axis (first direction X) and the Y-axis (second direction Y) may be referred to as an X-Y plane, and a plane defined by the X axis (first direction X) and the Z axis (third direction Z) may be referred to as an X-Z plane, and a plane defined by the Y axis (second direction Y) and the Z axis (third direction Z) may be referred to as a Y-Z plane. A view from the X-Y plane is referred to as a plan view.

Embodiment

A display device DSP according to the present embodiment is an organic electroluminescence display device including an organic light emitting diode (OLED) as a display element, and is mounted on a television, a personal computer, a mobile terminal, a mobile phone, or the like.

FIG. 1 is a diagram illustrating a configuration example of the display device DSP according to the present embodiment.

The display device DSP includes an insulating base 10. The base 10 may be glass or a flexible resin film. The display device DSP has a display area DA for displaying an image and a non-display area NDA around the display area DA.

The display device DSP includes a plurality of pixels PX arranged in a matrix in the first direction X and the second direction Y in the display area DA. Each of the pixels PX includes a plurality of sub-pixels SP1, SP2, and SP3. In one example, the pixel PX includes a red sub-pixel SP1, a green sub-pixel SP2, and a blue sub-pixel SP3. The pixel PX may include four or more sub-pixels formed by adding a sub-pixel of other colors such as white to the sub-pixels of the above three colors.

A configuration example of one sub-pixel SP included in the pixel PX will be briefly described.

That is, the sub-pixel SP includes a pixel circuit 1 and a display element 20 that is driven and controlled by the pixel circuit 1. The pixel circuit 1 includes a pixel switch 2, a drive transistor 3, and a capacitor 4. The pixel switch 2 and the drive transistor 3 are switching elements configured by, for example, a thin film transistor.

For the pixel switch 2, a gate electrode is connected to a scanning line GL, a source electrode is connected to a signal line SL, and a drain electrode is connected to one electrode forming the capacitor 4 and a gate electrode of the drive transistor 3. For the drive transistor 3, the source electrode is connected to the other electrode forming the capacitor 4 and a power supply line PL, and the drain electrode is connected to an anode of the display element 20. A cathode of the display element 20 is connected to a feeder line FL. A configuration of the pixel circuit 1 is not limited to the illustrated example.

The display element 20 is an organic light emitting diode (OLED) which is a light emitting element. For example, the sub-pixel SP1 includes the display element that emits light corresponding to a red wavelength, the sub-pixel SP2 includes the display element that emits light corresponding to a green wavelength, and the sub-pixel SP3 emits light corresponding to a blue wavelength. A configuration of the display element 20 will be described later.

FIG. 2 is a plan view illustrating a configuration example of the pixel PX according to the present embodiment. FIG. 2 illustrates only the configuration required for explanation.

The display device DSP includes an insulation layer 12, a lower electrode E1, and an auxiliary wiring CAW. In the example illustrated in FIG. 2, the display device DSP includes the insulation layer 12 (1211, 1212, 1213, 1214, 1221, and 1222), the lower electrode E1 (E11, E12, and E13), and the auxiliary wiring CAW (CAW11, CAW12, CAW13, CAW14, CAW21, and CAW22).

The lower electrode E1 is disposed in the sub-pixel SP. In the example illustrated in FIG. 2, the lower electrode E1 includes the lower electrodes E11, E12, and E13. The lower electrode E11 is disposed in the sub-pixel SP1. The lower electrode E12 is disposed in the sub-pixel SP2. The lower electrode E13 is disposed in the sub-pixel SP3. The lower electrodes E11 to E13 are disposed in the first direction X. The lower electrode including the lower electrodes E11 to E13 is an electrode disposed for each sub-pixel or each display element, and may be referred to as a pixel electrode, an anode, or the like.

The lower electrode E1 is formed in a rectangular shape in a plan view. In this case, the lower electrode E1 has four end portions Eg. In the example illustrated in FIG. 2, each of the lower electrodes E11 to E13 is formed in a rectangular shape having a minor axis in the first direction X and a major axis in the second direction Y. The lower electrode E11 has an end portion Eg (Eg11) on a distal end side of an arrow of the first direction X, an end portion Eg (Eg12) on the opposite side of the distal end of the arrow of the first direction X, an end portion Eg (Eg13) on a distal end side of the second direction Y, and an end portion Eg (Eg14) on the opposite side of the distal end of the second direction Y. The lower electrode E12 has an end portion Eg (Eg21) on the distal end side of the arrow of the first direction X, an end portion Eg (Eg22) on the opposite side of the distal end of the arrow of the first direction X, an end portion Eg (Eg23) on the distal end side of the second direction Y, and an end portion Eg (Eg24) on the opposite side of the distal end of the second direction Y. The lower electrode E13 has an end portion Eg (Eg31) on the distal end side of the arrow of the first direction X, an end portion Eg (Eg32) on the opposite side of the distal end of the arrow of the first direction X, an end portion Eg (Eg33) on the distal end side of the second direction Y, and an end portion Eg (Eg34) on the opposite side of the distal end of the second direction Y. The lower electrode E1 may be formed in shape other than the rectangular shape in a plan view.

The insulation layer 12 is formed in a lattice shape in a plan view. The insulation layer 12 is formed so as to partition the display element or the sub-pixel, and may be referred to as a bank, a rib, a partition wall, or the like. In the example illustrated in FIG. 2, the insulation layer 12 includes insulation layers (banks) 1211, 1212, 1213, 1214, 1221, and 1222. The insulation layers 1211, 1212, 1213, and 1214 extend in the second direction Y. The insulation layers 1211 to 1214 are disposed at intervals in the first direction X. The insulation layers 1211, 1212, 1213, and 1214 are disposed in the described order toward the distal end side of the arrow of the first direction X. The insulation layers 1221, and 1222 extend in the first direction X. The insulation layers 1221 and 1222 are disposed at intervals in the second direction Y. The insulation layers 1221 and 1222 are disposed in the described order toward the distal end side of the arrow of the second direction Y. The insulation layers 1211 to 1214, and the insulation layers 1221 and 1222 intersect with each other. The insulation layer 12 includes an opening portion OP that overlaps the lower electrode E1.

In the example illustrated in FIG. 2, the insulation layer 12 includes an opening portion OP1 overlapping the lower electrode E11, an opening portion OP2 overlapping the lower electrode E12, and an opening portion OP3 overlapping the lower electrode E13. The opening portion OP1 corresponds to an area surrounded by the insulation layers 1211 and 1212, and the insulation layers 1221 and 1222. That is, a central portion of the lower electrode E11 overlapping the opening portion OP1 is exposed from the insulation layer 12. The opening portion OP2 corresponds to an area surrounded by the insulation layers 1212 and 1213, and the insulation layers 1221 and 1222. That is, a central portion of the lower electrode E12 overlapping the opening portion OP2 is exposed from the insulation layer 12. The opening portion OP3 corresponds to an area surrounded by the insulation layers 1213 and 1214, and the insulation layers 1221 and 1222. That is, a central portion of the lower electrode E13 overlapping the opening portion OP3 is exposed from the insulation layer 12.

In the example illustrated in FIG. 2, the insulation layer 12 covers a peripheral edge portion of each of the lower electrodes E11 to E13. The insulation layer 1221 overlaps the end portion Eg14 of the lower electrode E11, the end portion Eg24 of the lower electrode E12, and the end portion Eg34 of the lower electrode E13. The insulation layer 1222 overlaps the end portion Eg11 of the lower electrode E11, the end portion Eg23 of the lower electrode E12, and the end portion Eg33 of the lower electrode E13. The insulation layer 1211 overlaps the end portion Eg12 of the lower electrode E11. The insulation layer 1212 overlaps the end portion Eg11 of the lower electrode E11, and the end portion Eg22 of the lower electrode E12. The insulation layer 1213 overlaps the end portion Eg21 of the lower electrode E12, and the end portion Eg32 of the lower electrode E13. The insulation layer 1214 overlaps the end portion Eg31 of the lower electrode E13.

The auxiliary wiring CAW overlaps the insulation layer 12. For example, the auxiliary wiring CAW is disposed in a lattice shape so as to overlap the insulation layer 12 in a plan view. For example, the auxiliary wiring CAW does not overlap the lower electrode E1 in a plan view.

In the example illustrated in FIG. 2, the auxiliary wiring CAW includes auxiliary wirings CAW11, CAW12, CAW13, CAW14, CAW21, and CAW22. The auxiliary wirings CAW11, CAW12, CAW13, and CAW14 extend in the second direction Y. The auxiliary wirings CAW11 to CAW14 are disposed at intervals in the first direction X. For example, the auxiliary wirings CAW11, CAW12, CAW13, and CAW14 are disposed in the described order toward the distal end side of the arrow of the first direction X. The auxiliary wirings CAW21 and CAW22 extend in the first direction X. The auxiliary wirings CAW21 and CAW22 are disposed at intervals in the second direction Y. For example, the auxiliary wirings CAW21 and CAW22 are disposed in the described order toward the distal end side of the arrow of the second direction Y. The auxiliary wirings CAW11 to CAW14 and the auxiliary wirings CAW21 and CAW22 intersect with each other.

In the example illustrated in FIG. 2, the auxiliary wiring CAW11 overlaps the insulation layer 1211, the auxiliary wiring CAW12 overlaps the insulation layer 1212, the auxiliary wiring CAW13 overlaps the insulation layer 1213, and the auxiliary wiring CAW14 overlaps the insulation layer 1214. The auxiliary wiring CAW21 overlaps the insulation layer 1221, and the auxiliary wiring CAW22 overlaps the insulation layer 1222. The auxiliary wirings CAW11 to CAW14 and the auxiliary wirings CAW21 and CAW22 do not overlap the lower electrode E1.

Here, an outer shape of the sub-pixel SP corresponds to, for example, an outer shape of the lower electrode E1. That is, the sub-pixel SP1, the sub-pixel SP2, and the sub-pixel SP3, which form one pixel PX, are each formed in a substantially rectangular shape extending in the second direction Y, and are disposed in the first direction X. Light emission colors of adjacent sub-pixels disposed in the first direction X are different from each other. The light emission colors of the adjacent sub-pixels disposed in the first direction X may be the same. The areas of the sub-pixel SP1, the sub-pixel SP2, and the sub-pixel SP3 may be the same, or may be different from each other as described later. An outer shape of the sub-pixel may be defined by an outer shape of the light emitting area of the display element.

Figure 3:
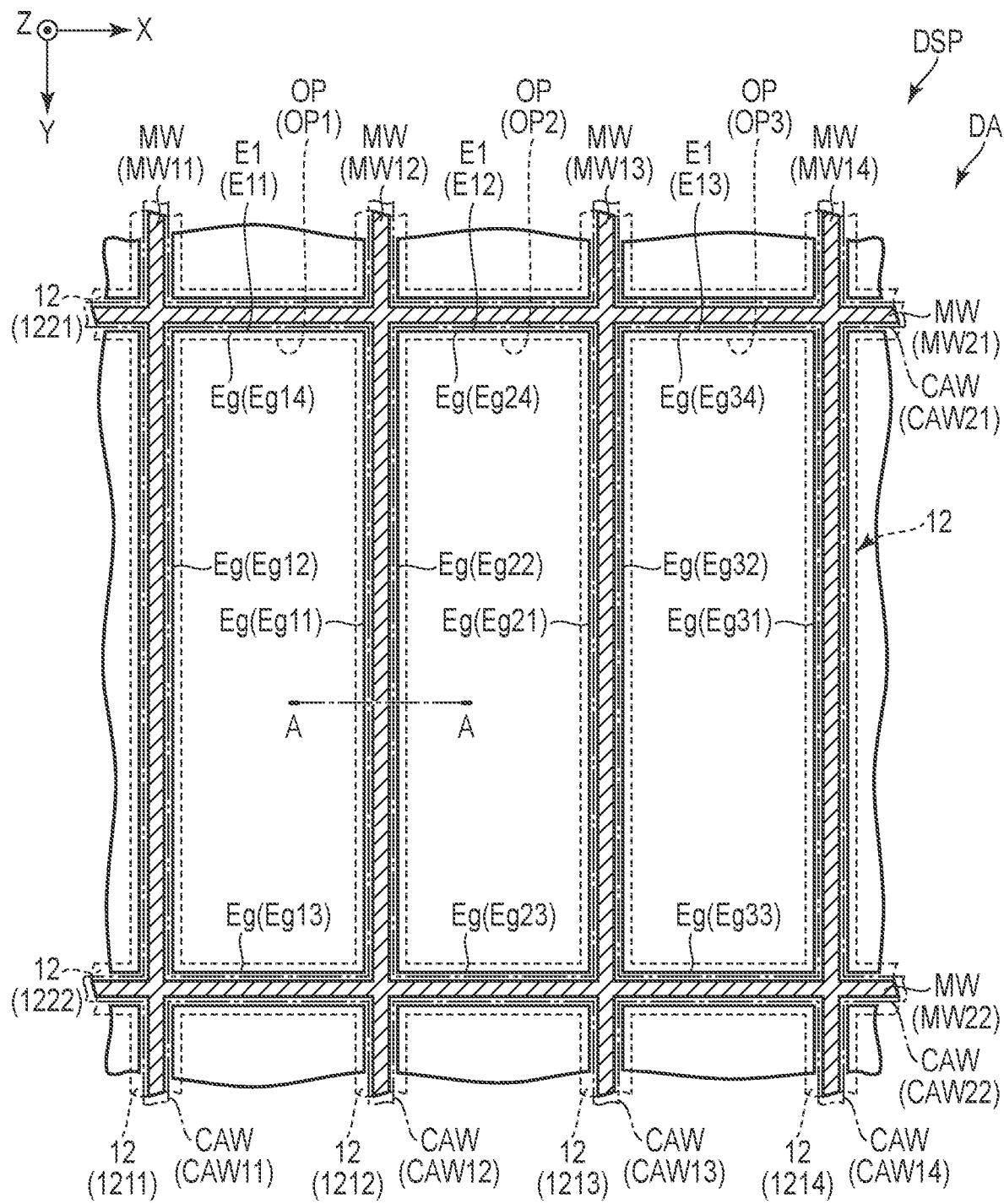
FIG. 3 is a plan view illustrating a configuration example of a metal wiring according to an embodiment.

FIG. 3 is a plan view illustrating a configuration example of a metal wiring MW according to the present embodiment. The configuration illustrated in FIG. 3 corresponds to the configuration illustrated in FIG. 2. FIG. 3 illustrates only the configuration required for explanation.

The display device DSP includes the metal wiring MW. In the example illustrated in FIG. 3, the display device DSP includes the insulation layer 12 (1211, 1212, 1213, 1214, 1221, and 1222), the lower electrode E1 (E11, E12, and E13), and the metal wiring MW (MW11, MW12, MW13, MW14, MW21, and MW22).

The metal wiring MW overlaps the insulation layer 12. For example, the metal wiring MW is disposed in a lattice shape so as to overlap the insulation layer 12 in a plan view. The metal wiring MW overlaps the auxiliary wiring CAW. For example, the metal wiring MW is disposed in a lattice shape so as to overlap the auxiliary wiring CAW in a plan view. For example, the metal wiring MW does not overlap the lower electrode E1 in a plan view. The metal wiring MW forms a capacitance (parasitic capacitance) between the auxiliary wiring CAW and the metal wiring MW. The metal wiring MW is connected to a predetermined wiring. For example, the metal wiring MW may be connected to a transistor. The metal wiring MW may be in a floating state. The metal wiring MW may not be disposed in a lattice shape. "Same", "Identical", and "Equivalent" mean that the physical quantities, materials, configurations (structures) of a plurality of target objects, spaces, or areas are exactly the same, and also mean that it is slightly different to the extent that it is regarded to be substantially the same.

In the example illustrated in FIG. 3, the metal wiring MW includes the metal wirings MW11, MW12, MW13, MW14, MW21, and MW22. The metal wirings MW11, MW12, MW13, and MW14 extend in the second direction Y. The metal wirings MW11 to MW14 are disposed at intervals in the first direction X. For example, the metal wirings MW11, MW12, MW13, and MW14 are disposed in the described order toward the distal end side of the arrow of the first direction X. The metal wirings MW21 and MW22 extend in the first direction X. The metal wirings MW21 and MW22 are disposed at intervals in the second direction Y. For example, the metal wirings MW21 and MW22 are disposed in the described order toward the distal end side of the arrow of the second direction Y. The metal wirings MW11 to MW14 and the metal wirings MW21 and MW22 intersect with each other.

In the example illustrated in FIG. 3, the metal wiring MW11 overlaps the insulation layer 1211, the metal wiring MW12 overlaps the insulation layer 1212, the metal wiring MW13 overlaps the insulation layer 1213, and the metal wiring MW14 overlaps the insulation layer 1214. The metal wiring MW21 overlaps the insulation layer 1221, and the metal wiring MW22 overlaps the insulation layer 1222. The metal wirings MW11 to MW14, and the metal wirings MW21 and MW22 do not overlap the lower electrode E1.

In the example illustrated in FIG. 3, the metal wiring MW11 overlaps the auxiliary wiring CAW11, the metal wiring MW12 overlaps the auxiliary wiring CAW12, the metal wiring MW13 overlaps the auxiliary wiring CAW13, and the metal wiring MW14 overlaps the auxiliary wiring CAW14. The metal wiring MW21 overlaps the auxiliary wiring CAW21, and the metal wiring MW22 overlaps the auxiliary wiring CAW22.

FIG. 4 is a cross-sectional view illustrating a configuration example of the display device DSP taken along line A-A shown in FIG. 3. FIG. 4 illustrates only a main part of the display device DSP.

The display device DSP includes the base 10, the insulation layer 11, the lower electrode E1 (E11 and E12), the metal wiring MW (MW12), the insulation layer 12 (1212), an organic layer OR (OR1, OR2, and OR3), an upper electrode E2 (E21, E22, and E23), and the auxiliary wiring CAW (CAW12). The display device DSP includes the display element 20. The display element 20 (20A and 20B) is formed by the lower electrode E1 (E11 and E12), the organic layer OR (OR1 and OR2), and the upper electrode E2 (E21 and E22).

In the example illustrated in FIG. 4, the display element 20 includes display elements 20A and 20B. The display element 20A is formed by the lower electrode E11, the organic layer OR1, and the upper electrode E21. A display element 20B is formed by the lower electrode E12, the organic layer OR2, and the upper electrode E22.

The insulation layer 11 is disposed on the base 10. The insulation layer 11 corresponds to an underlayer of the display element 20, and is, for example, an organic insulation layer. The pixel switch 2 of the pixel circuit 1 illustrated in FIG. 1 is disposed on the base 10 and covered by the insulation layer, for example, the insulation layer 11, but the illustration is omitted here. In the example illustrated in FIG. 4, the insulation layer 11 corresponds to the underlayer of the display elements 20A and 20B. The insulation layer 11 may be formed by a single layer or a plurality of layers. Another layer may be disposed between the base 10 and the insulation layer 11.

The lower electrode E1 is disposed on the insulation layer 11. In the example illustrated in FIG. 4, the lower electrode E1 includes the lower electrodes E11 and E12. The lower electrodes E11 and E12 are disposed on the insulation layer 11. A plurality of the lower electrodes E1 are disposed at intervals in the first direction X. In the example illustrated in FIG. 4, the end portion Eg11 of the lower electrode E11 and the end portion Eg22 of the lower electrode E11 are disposed with a gap (or spacing) GP1 in the first direction X. Although not illustrated, the lower electrode E1 may be electrically connected to a switching element via a contact hole formed in the insulation layer 11. For example, although not illustrated, the lower electrode E11 may be electrically connected to the switching element via the contact hole formed in the insulation layer 11. For example, although not illustrated, the lower electrode E12 may be electrically connected to the switching element via the contact hole formed in the insulation layer 11. Another layer may be disposed between the lower electrode E1 and the insulation layer 11.

The lower electrode E1 (E11 and E12) is a transparent electrode formed of a transparent conductive material such as indium tin oxide (ITO) or indium zinc oxide (IZO). The lower electrode E1 may be a metal electrode formed of a metal material such as silver or aluminum. The lower electrode E1 may be a laminate of the transparent electrode and the metal electrode. For example, the lower electrode E1 may be formed by a single layer, may be configured as a laminate formed by stacking the transparent electrode, the metal electrode, and the transparent electrode in this order, or configured as a laminate having three or more layers.

The metal wiring MW is disposed on the insulation layer 11. The metal wiring MW may be disposed on a layer other than the insulation layer 11. In the example illustrated in FIG. 4, the metal wiring MW includes the metal wiring MW12. The metal wiring MW12 is disposed on the insulation layer 11. That is, the metal wiring MW12 is disposed on the same layer on which the lower electrodes E11 and E12 are disposed. The metal wiring MW12 may be disposed on a layer other than the insulation layer 11. That is, the metal wiring MW12 may be disposed on a layer different from the layer on which the lower electrodes E11 and E12 are disposed.

The metal wiring MW is disposed between two adjacent lower electrodes E1. In the example illustrated in FIG. 4, the metal wiring MW12 has a width W1. The metal wiring MW12 is disposed at a center portion of the gap GP1 between the lower electrodes E11 and E12 in the first direction X. The metal wiring MW12 is separated from the end portion Eg11 of the lower electrode E11 by a gap GP2 in the first direction X, and is separated from the end portion Eg22 of the lower electrode E12 by the gap GP2 in the first direction X. The metal wiring MW12 may be disposed to be separated from the center portion of the gap GP1 between the lower electrodes E11 and E12. The metal wiring MW12 may be separated from each of the end portion Eg11 of the lower electrode E11 and the end portion Eg22 of the lower electrode E12 by a different gap.

The metal wiring MW is formed of, for example, the same material as that of the lower electrode E1. The metal wiring MW may be formed of a material different from that of the lower electrode E1. The metal wiring MW is a transparent electrode formed of a transparent conductive material such as indium tin oxide (ITO) or indium zinc oxide (IZO). The metal wiring MW may be a metal electrode formed of a metal material such as silver or aluminum. The metal wiring MW may be a laminate of the transparent electrode and the metal electrode. For example, the metal wiring MW may be configured as the laminate formed by stacking the transparent electrode, the metal electrode, and the transparent electrode in this order, or configured as the laminate having three or more layers. The metal wiring MW may be formed by a single layer. The metal wiring MW may be used for forming a capacitance that holds electric charges of the pixel. In a case where the metal wiring MW is formed of the same material and in the same layer as those of the lower electrode E1, it is not necessary to add a new process to form the capacitance, and the display device DSP can be manufactured at low cost.

The insulation layer 12 is disposed on the insulation layer 11, the lower electrode E1, and the metal wiring MW. The insulation layer 12 is, for example, an organic insulation layer. The insulation layer 12 includes the opening portion OP (OP1 and OP2). The opening portion OP is formed on the lower electrode E1. The opening portion OP is formed by penetrating the insulation layer 12 to the lower electrode E1. In the example illustrated in FIG. 4, the insulation layer 12 includes the opening portion OP1, the opening portion OP2, and a bank 1212. The opening portion OP1 is formed on the lower electrode E11. The opening portion OP2 is formed on the lower electrode E12. The bank 1212 is located above the insulation layer 11, the end portion Eg11 of the lower electrode E11, the end portion Eg22 of the lower electrode E12, and the metal wiring MW12. In other words, the bank 1212 overlaps (or is opposed to) the metal wiring MW12. In the bank 1212, for example, a flat portion FP1 is formed at a top portion. In the insulation layer 12, the flat portion FP1 is formed, for example, from a portion corresponding to the end portion Eg11 of the lower electrode E11 to a portion corresponding to the end portion Eg22 of the lower electrode E12. The bank 1212 has, for example, a surface curved from the opening portion OP1 to the flat portion FP1 and a surface curved from the opening portion OP2 to the flat portion FP1. The bank 1212 has a thickness TH1. In the example illustrated in FIG. 4, the thickness TH1 corresponds to a distance between the highest position of the bank 1212, for example, the flat portion FP1 and the insulation layer 11. The thickness TH1 is several μm, for example 1.5 μm to 2.0 μm.

The organic layer OR is disposed on the lower electrode E1 and the insulation layer 12. In the example illustrated in FIG. 4, the organic layer OR includes the organic layers OR1, OR2, and OR3. The organic layer OR1 is disposed on the lower electrode E11 corresponding to the opening portion OP1 and on the bank 1212. In the bank 1212, the organic layer OR1 is disposed on a surface curved from the lower electrode E11 corresponding to the opening portion OP1 to the flat portion FP1. The organic layer OR2 is disposed on the lower electrode E12 corresponding to the opening portion OP2 and on the bank 1212. In the bank 1212, the organic layer OR2 is disposed on a surface curved from the lower electrode E12 corresponding to the opening portion OP2 to the flat portion FP1 of the bank 1212. The organic layer OR3 is disposed on the auxiliary wiring CAW12 to be described later. The organic layers OR1 to OR3 are not in contact with each other. In other words, the organic layers OR1 to OR3 are separated. That is, the organic layer OR1 is separated from the organic layers OR2 and OR3, the organic layer OR2 is separated from the organic layers OR3 and OR1, and the organic layer OR3 is separated from the organic layers OR1 and OR2. The organic layer OR1 is in contact with the auxiliary wiring CAW12 to be described later, for example, the end portion of the auxiliary wiring CAW12 which is opposite to the distal end side of the arrow of the first direction X. The organic layer OR1 may not be in contact with the auxiliary wiring CAW12. The organic layer OR2 is in contact with the auxiliary wiring CAW12 to be described later, for example, the end portion of the auxiliary wiring CAW12 on the distal end side of the arrow of the first direction X. The organic layer OR2 may not be in contact with the auxiliary wiring CAW12.

The organic layer OR includes a light emitting layer that emits light with the magnitude of a current flowing by applying a predetermined voltage between the lower electrode E1 and the upper electrode E2. In addition to the light emitting layer, the organic layer OR includes at least one of a hole injection layer, a hole transport layer, an electron injection layer, and an electron transport layer. For example, the organic layers OR1 to OR3 include the light emitting layers of the same color. The organic layers OR1 to OR3 may include the light emitting layers of the different color.

The upper electrode E2 is disposed on the organic layer OR. The upper electrode E2 covers the organic layer OR. In the example illustrated in FIG. 4, the upper electrode E2 includes the upper electrodes E21, E22, and E23. The upper electrode E21 is disposed on the organic layer OR1. The upper electrode E21 covers the organic layer OR1. The upper electrode E22 is disposed on the organic layer OR2. The upper electrode E22 covers the organic layer OR2. The upper electrode E23 is disposed on the organic layer OR3. The upper electrode E23 covers the organic layer OR3. The upper electrode E21 is in contact with the auxiliary wiring CAW12 to be described later, for example, the end portion of the auxiliary wiring CAW12 which is opposite to the distal end side of the arrow of the first direction X. The upper electrode E22 is in contact with the auxiliary wiring CAW12 to be described later, for example, the end portion of the auxiliary wiring CAW12 on the distal end side of the first direction X. The upper electrode E23 is separated from the upper electrodes E21 and E22.

The upper electrode E2 is, for example, a transparent electrode formed of a transparent conductive material such as ITO or IZO. The upper electrode E2 is electrically connected to the feeder line FL located in the display area DA illustrated in FIG. 1. The upper electrode E2 is an electrode commonly disposed for a plurality of the sub-pixels or a plurality of the display elements, and may be referred to as a common electrode, a counter electrode, a cathode, or the like. The upper electrode E2 may be covered by a transparent protective layer (including at least one of an inorganic insulation layer and an organic insulation layer). The upper electrode E2 may be formed by a single layer or formed as the laminate.

The auxiliary wiring CAW is disposed on the insulation layer 12. The auxiliary wiring CAW overlaps (or is opposed to) the metal wiring MW. In the example illustrated in FIG. 4, the auxiliary wiring CAW includes the auxiliary wiring CAW12. The auxiliary wiring CAW12 is disposed on the bank 1212. The auxiliary wiring CAW12 is disposed on, for example, the flat portion FP1 of the bank 1212. The auxiliary wiring CAW12 overlaps (or is opposed to) the metal wiring MW12.

The auxiliary wiring CAW is disposed between two adjacent organic layers OR. In other words, the auxiliary wiring CAW is disposed between two adjacent upper electrodes E2. In the example illustrated in FIG. 4, the auxiliary wiring CAW12 is disposed between the organic layers OR1 and OR2. In other words, the auxiliary wiring CAW12 is disposed between the upper electrode E21 and the upper electrode E22.

The auxiliary wiring CAW separates (or divides) two adjacent organic layers OR from each other. The auxiliary wiring CAW separates (or divides) two adjacent upper electrodes E2 from each other and electrically connects two adjacent upper electrodes E2. In the example illustrated in FIG. 4, the auxiliary wiring CAW12 separates (or divides) the organic layer OR1 from the organic layer OR2. The auxiliary wiring CAW12 separates (or divides) the upper electrodes E21 from the upper electrode E22 being adjacent to each other, and electrically connects the upper electrode E21 with the upper electrode E22, the upper electrode E21 and upper electrode E22 being adjacent to each other.

The auxiliary wiring CAW is a metal wiring, for example, a low resistance metal wiring. For example, the auxiliary wiring CAW can be used to assist in lowering resistance of a layer with high electrical resistance, the layer including the transparent conductive material such as indium tin oxide (ITO) and indium zinc oxide (IZO).

The auxiliary wiring CAW is formed by a laminate. The auxiliary wiring CAW may not be formed as a laminate, and may be formed by a single layer. The auxiliary wiring CAW is formed by a three-layer metal film, for example, a titanium (Ti)/aluminum (Al)/titanium (Ti) layer. In the example illustrated in FIG. 4, the auxiliary wiring CAW12 includes an upper layer LL, a middle layer ML, and a lower layer UL. The upper layer LL, the middle layer ML, and the lower layer UL are, for example, low resistance metal wirings. The upper layer LL is formed of, for example, titanium (Ti). The middle layer ML is formed of, for example, aluminum (Al). The lower layer UL is formed of, for example, titanium (Ti). In the auxiliary wiring CAW12, the upper layer LL and the middle layer ML may be semiconductors or insulators, and the lower layer UL may be a low resistance metal wiring.

In the example illustrated in FIG. 4, the lower layer UL is disposed, for example, on the flat portion FP1 of the bank 1212. In the auxiliary wiring CAW12, the middle layer ML is disposed on the lower layer UL, and the upper layer LL is disposed on the middle layer ML. In the auxiliary wiring CAW12, the middle layer ML recedes toward the center portion or inward from the lower layer UL and the upper layer LL. In other words, a width W3 of the middle layer ML is smaller than a width W2 of the lower layer UL and the width W2 of the upper layer LL. That is, the width W2 of the upper layer LL and the width W2 of the lower layer UL are greater than the width W3 of the middle layer ML. The width W2 of the upper layer LL and the width W2 of the lower layer UL are the same. The width W2 of the upper layer LL and the width W2 of the lower layer UL may be different from each other. The width W2 of the upper layer LL and the width W2 of the lower layer UL are, for example, the same as the width of the flat portion FP1. The width of the upper layer LL and the width of the lower layer UL may be different from each other. The width W2 of the upper layer LL may be different from the width W1 of the metal wiring MW12. The width W2 of the upper layer LL may be the same as the width W1 of the metal wiring MW12. The width W3 of the middle layer ML may be the same as the width W1 of the metal wiring MW12. The width W3 of the middle layer ML may be different from the width W1 of the metal wiring MW12. The width W2 of the lower layer UL may be different from the width W1 of the metal wiring MW12. The width W2 of the lower layer UL may be the same as the width W1 of the metal wiring MW12.

In the example illustrated in FIG. 4, in the auxiliary wiring CAW12, the upper layer LL and the lower layer UL extend more from the middle layer ML. In the auxiliary wiring CAW12, the upper layer LL has a function as a cover for the middle layer ML that prevents the organic layer OR from adhering to the middle layer ML. In the auxiliary wiring CAW12, the lower layer UL has a function of electrically connecting the upper electrodes E21 with the upper electrode E22, reducing the resistance of the layer having high electrical resistance, for example, the upper electrode E2, and forming the capacitance (parasitic capacitance) between the lower layer UL and the opposing electrode, for example, the metal wiring MW.

In the example illustrated in FIG. 4, a thickness TH2 of the auxiliary wiring CAW12 is equal to or greater than the thickness formed by stacking the organic layer OR (OR1 and OR2) and the upper electrode E2 (E21 and E22) which are disposed on the bank 1212. The thickness TH2 corresponds to, for example, a distance between the flat portion FP1 and the organic layer OR3. The upper layer LL is separated from the upper electrodes E21 and E22. That is, the upper layer LL is not in contact with the upper electrodes E21 and E22. The middle layer ML is separated from the upper electrodes E21 and E22. That is, the middle layer ML is not in contact with the upper electrodes E21 and E22. The lower layer UL is in contact with the upper electrodes E21 and E22. The lower layer UL is in contact with the organic layers OR1 and OR2. The lower layer UL may not be in contact with the organic layers OR1 and OR2. In other words, the lower layer UL may be separated from the organic layers OR1 and OR2. The lower layer UL of the auxiliary wiring CAW12 is separated from the metal wiring MW12 by the distance TH3. The auxiliary wiring CAW12 forms a capacitance between the metal wiring MW12 and the auxiliary wiring CAW12. In other words, the lower layer UL of the auxiliary wiring CAW12 forms a capacitance Cs1 between the metal wiring MW12 and the lower layer UL.

In the display element 20, a light emitting area is formed by disposing the organic layer OR between the lower electrode E1 and the upper electrode E2. In the example illustrated in FIG. 4, in the display element 20A, the light emitting area is formed by disposing the organic layer OR1 between the lower electrode E11 and the upper electrode E21. In the display element 20B, the light emitting area is formed by disposing the organic layer OR2 between the lower electrode 512 and the upper electrode E22. Since the organic layer OR3 is disposed between the auxiliary wiring CAW12 and the upper electrode E23 and is completely separated from the organic layer OR1 and the organic layer OR2, the organic layer OR3 hardly emits the light or does not emit the light. Since a portion of the organic layer OR1 which covers the bank 1212 is located between the bank 1212 and the upper electrode E21, the portion thereof hardly emits the light. Similarly, since a portion of the organic layer OR2 which covers the bank 1212 is located between the bank 1212 and the upper electrode E22, the portion thereof hardly emits the light.

In the display device DSP, for example, the organic layer OR is formed by a vacuum deposition method. In the example illustrated in FIG. 4, after forming the bank 1212, an organic material for forming the organic layer OR (OR1 to OR3) is vapor-deposited. In a case where the organic material is vapor-deposited, the organic layer OR is vapor-deposited on the upper layer LL, and the organic layer OR is not attached to the middle layer ML due to a shadowing effect of the upper layer LL. The organic layer OR is attached to the lower layer UL, for example, the end portion of the lower layer UL. In the example illustrated in FIG. 4, the organic layer OR1 is in contact with the end portion of the lower layer UL which is opposite to the distal end side of the arrow of the first direction X. The organic layer OR1 may not be in contact with the end portion of the lower layer UL which is opposite to the distal end side of the arrow of the first direction X. The organic layer OR2 is in contact with the end portion of the lower layer UL on the distal end side of the arrow of the first direction X. The organic layer OR2 may not be in contact with the end portion of the lower layer UL on the distal end side of the arrow of the first direction X. The upper electrode E2 is formed by, for example, a sputtering method. In a case of being formed by the sputtering method, the upper electrode E2 is attached to the lower layer UL and is electrically connected to the auxiliary wiring CAW. In the example illustrated in FIG. 4, the upper electrode E21 wraps around further inside than the organic layer OR1 which is attached to the end portion of the lower layer UL opposite to the distal end side of the arrow of the first direction X to be attached to the lower layer UL and is electrically connected to the lower layer UL of the auxiliary wiring CAW12. The upper electrode E22 wraps around further inside than the organic layer OR2 attached to the end portion of the lower layer UL on the distal end side of the arrow of the first direction X to be attached to the lower layer UL, and is electrically connected to the lower layer UL of the auxiliary wiring CAW12. Therefore, the upper electrodes E21 and E22 are electrically connected via the lower layer UL.

In the example illustrated in FIG. 4, the auxiliary wiring CAW12 is sputtered and formed by overlapping the upper layer LL, the middle layer ML, and the lower layer UL. The auxiliary wiring CAW12, which is formed by overlapping the upper layer LL, the middle layer ML, and the lower layer UL and performing a sputtering film formation, is patterned in a photolithography process and etched to obtain a three layer film of which a cross section is rectangular. After that, the middle layer (for example, aluminum) ML is selectively etched by using a weak alkali or aluminum etching solution so that the auxiliary wiring CAW12 of which the middle layer (for example, aluminum) ML is recessed is obtained.

According to the present embodiment, the display device DSP includes the metal wiring MW, for example, the metal wiring MW12, and the auxiliary wiring CAW, for example, the auxiliary wiring CAW12, the metal wiring MW and auxiliary wiring CAW overlapping (or being opposed to) each other via the insulation layer 12, for example, the bank 1212. The metal wiring MW and the auxiliary wiring CAW form a capacitance via the insulation layer 12. For example, the metal wiring MW12 and the auxiliary wiring CAW12 form a capacitance Cs1 via the bank 1212. Therefore, a capacity of the display device DSP can be increased at low cost with a small area and with almost no additional process. Therefore, the display device DSP can have a high definition and a narrow frame.

Next, modified examples of the present embodiment will be described with reference to FIGS. 5 to 14. In the modified examples of the present embodiment to be described below, the same reference numerals are given to the same parts as the description above, the detailed description thereof will be omitted, and the parts different from the description above will be mainly described. In other modified examples, the same effect as that of the embodiment described above can be obtained.

First Modified Example

The display device DSP of the first modified example differs from the display device DSP of the embodiment described above in a configuration of the bank 1212.

Figure 5:
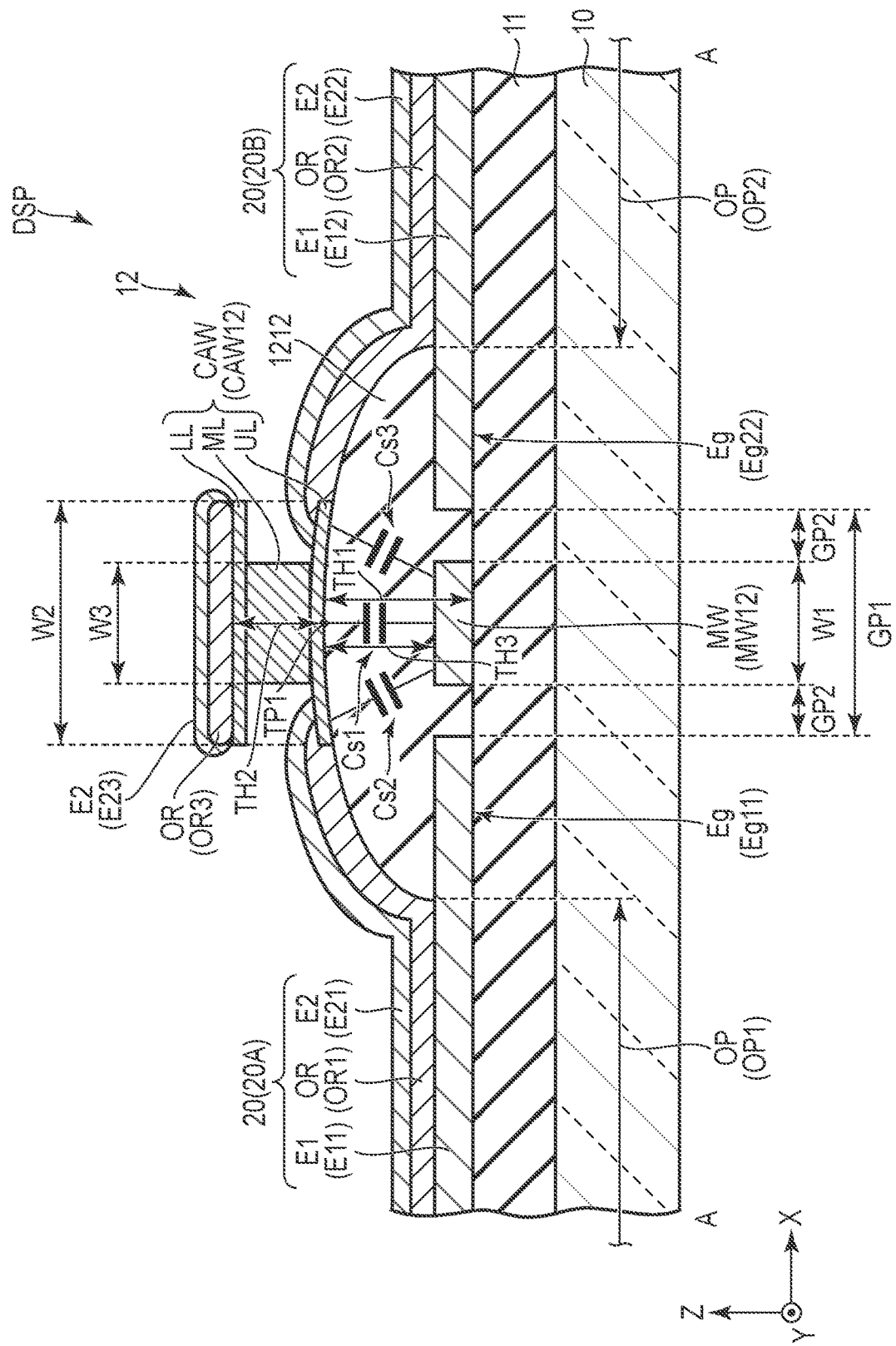
FIG. 5 is a cross-sectional view illustrating a configuration example of a display device according to a first modified example.

FIG. 5 is a cross-sectional view illustrating a configuration example of the display device DSP according to the first modified example. FIG. 5 illustrates only the main part of the display device DSP.

In the example illustrated in FIG. 5, the bank 1212 has a top point TP1. The bank 1212 is curved towards the top point TP1. In other words, the bank 1212 is formed in a semicircular shape or a mountain shape. The bank 1212 has, for example, a surface curved from the opening portion OP1 to the top point TP1 and a surface curved from the opening portion OP2 to the top point TP1. The bank 1212 has a thickness TH1. The thickness TH1 corresponds to a distance between the highest position of the bank 1212, for example, the top point TP1 and the insulation layer 11.

In the example illustrated in FIG. 5, the auxiliary wiring CAW12 is in contact with the top point TP1 of the bank 1212, is curved along the shape of the bank 1212, and is disposed on the bank 1212. The lower layer UL of the auxiliary wiring CAW12 is, for example, in contact with the top point TP1 of the bank 1212, is curved along the shape (curved shape) of the bank 1212, and is disposed on the bank 1212. A bottom portion of the middle layer ML of the auxiliary wiring CAW12 is, for example, curved along the shape (curved surface) of the lower layer UL.

In the example illustrated in FIG. 5, the thickness TH2 of the auxiliary wiring CAW12 corresponds to a distance between the top point TP1 of the bank 1212 and the organic layer OR3. A portion of the lower layer UL, which is located at the top point TP1 of the bank 1212, is separated from the metal wiring MW12 by a distance TH3. The capacitance Cs1 is formed between the metal wiring MW and portion of the lower layer UL which is located in the vertical direction from the metal wiring MW12. Since the lower layer UL is curved with respect to the metal wiring MW12, a capacitance Cs2 is formed between the metal wiring MW and a portion of the lower layer UL which is located in an oblique direction from the metal wiring MW12. Since the lower layer UL is curved with respect to the metal wiring MW12, a capacitance Cs3 is formed between the metal wiring MW and a portion of the lower layer UL which is located in an oblique direction from the metal wiring MW12.

Therefore, in the display device DSP according to the first modified example, the same effect as that of the display device DSP according to the embodiment described above is obtained. In addition, the capacity of the display device DSP of the first modified example can be more increased than that of the display device DSP of the embodiment described above.

Second Modified Example

The display device DSP of the second modified example differs from the display device DSP of the embodiment described above in a configuration of the bank 1212.

Figure 6:
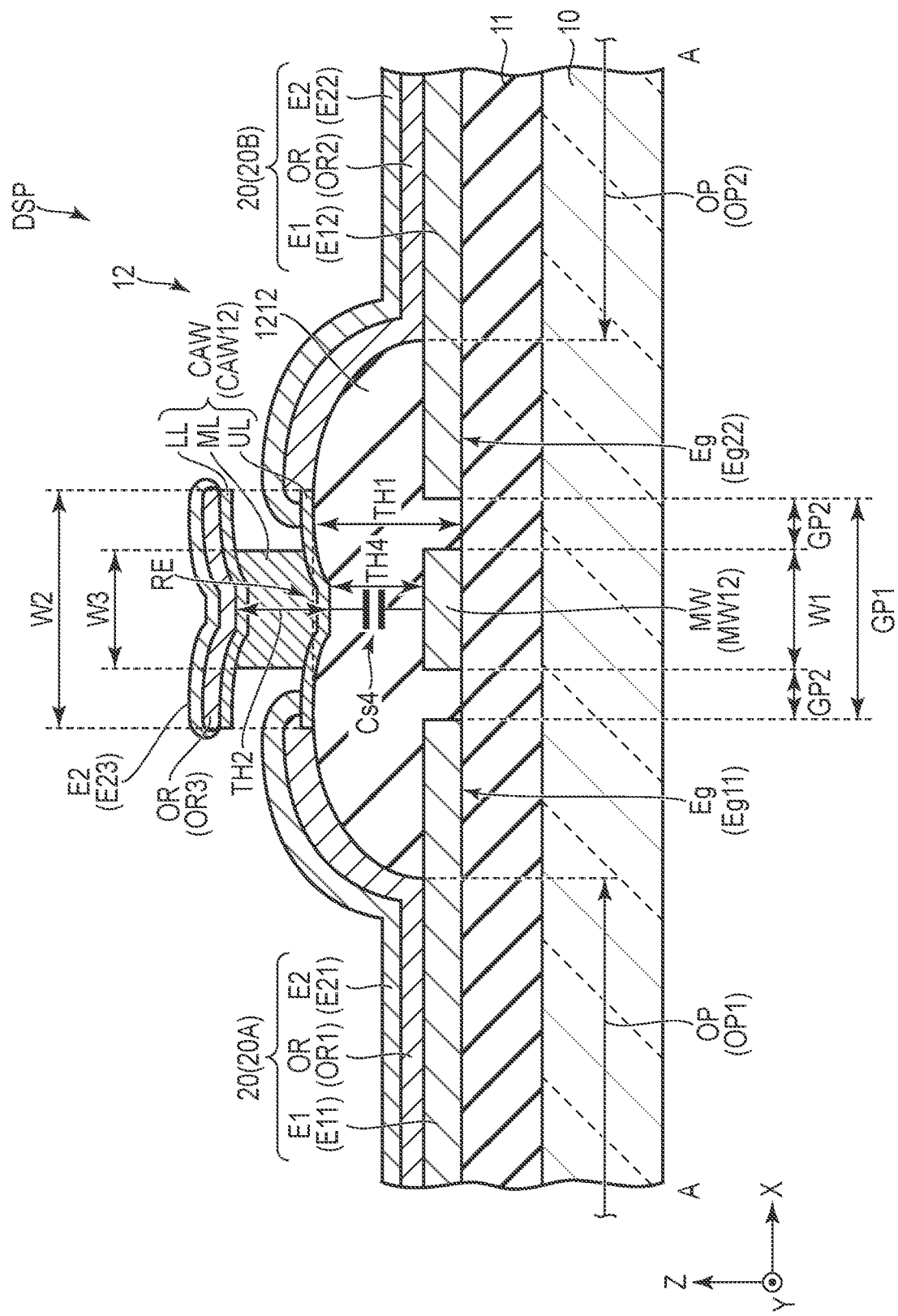
FIG. 6 is a cross-sectional view illustrating a configuration example of a display device according to a second modified example.

FIG. 6 is a cross-sectional view illustrating a configuration example of the display device DSP according to the second modified example. FIG. 6 illustrates only the main part of the display device DSP.

In the example illustrated in FIG. 6, in the bank 1212, for example, a recess portion RE is formed which is recessed toward a lower side. The recess portion RE is located between the lower electrodes E11 and E12. In other words, the recess portion RE is located between the organic layers OR1 and OR2. In other words, the recess portion RE is located between the upper electrodes E21 and E22. For example, the recess portion RE is formed in a portion opposed to the metal wiring MW or a portion located directly above the metal wiring MW. For example, the recess portion RE is formed in a portion opposed to the metal wiring MW of the flat portion FP1 of the bank 1212 illustrated in FIG. 4 or a portion located directly above the metal wiring MW. The bottom portion of the recess portion RE is formed, for example, flat. The bottom portion of the recess portion RE may not be formed flat, for example, may be curved. A width of the recess portion RE is smaller than, for example, the width W1 of the metal wiring MW. The width of the recess portion RE may be equal to or greater than the width W1 of the metal wiring MW. A depth of the recess portion RE is, for example, equal to or less than the thickness TH2 of the auxiliary wiring CAW.

In the example illustrated in FIG. 6, the auxiliary wiring CAW12 is disposed in the recess portion RE of the bank 1212. The lower layer UL of the bank 1212 is located, for example, in the recess portion RE of the bank 1212. The lower layer UL is curved downward along the shape of the recess portion RE. In other words, the lower layer UL is recessed downward along the shape of the recess portion RE. The middle layer ML is, for example, curved downward along the shape of the lower layer UL. In other words, the middle layer ML is recessed downward along the shape of the lower layer UL. The upper layer LL is, for example, curved downward along the shape of the middle layer ML. In other words, the upper layer LL is recessed downward along the shape of the middle layer ML. A portion of the lower layer UL, which is located in the recess portion RE of the bank 1212, is separated from the metal wiring MW12 by a distance TH4. The distance TH4 is smaller than the distance TH3. The lower layer UL of the auxiliary wiring CAW12 forms a capacitance Cs4 between the metal wiring MW12 and the lower layer UL. The capacitance Cs4 is greater than the capacitance Cs1.

Therefore, in the display device DSP according to the second modified example, the same effect as that of the display device DSP according to the embodiment described above is obtained. In addition, the capacity of the display device DSP of the second modified example can be more increased than that of the display device DSP of the embodiment.

Third Modified Example

The display device DSP of the third modified example is different from the display device DSP of the second modified example in a configuration of the metal wiring MW12.

Figure 7:
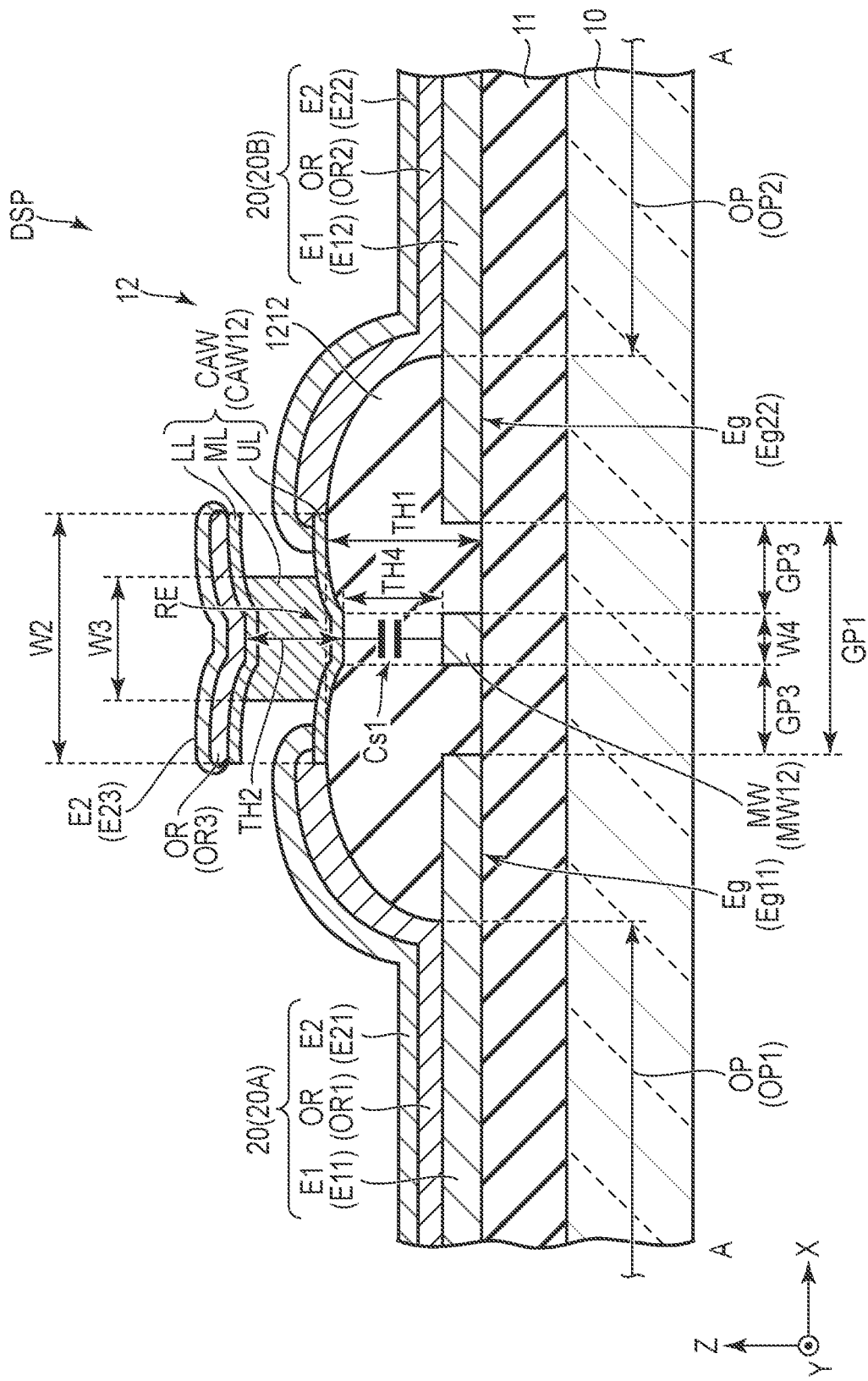
FIG. 7 is a cross-sectional view illustrating a configuration example of a display device according to a third modified example.

FIG. 7 is a cross-sectional view illustrating a configuration example of the display device DSP according to the third modified example. The display device DSP illustrated in FIG. 7 corresponds to the display device DSP illustrated in FIG. 6. FIG. 7 illustrates only the main part of the display device DSP.

In the example illustrated in FIG. 7, the metal wiring MW12 has a width W4. The width W4 is, for example, smaller than the width W1. The metal wiring MW12 is separated from the end portion Eg11 of the lower electrode E11 by a gap GP3 in the first direction X, and is separated from the end portion Eg22 of the lower electrode 512 by the gap GP3 in the first direction X. The gap GP3 is greater than the gap G2. The metal wiring MW12 may be separated from each of the end portion Eg11 of the lower electrode E11 and the end portion Eg22 of the lower electrode 512 by a different gap.

In the example illustrated in FIG. 7, the lower layer UL of the auxiliary wiring CAW12 forms the capacitance Cs1 between the metal wiring MW12 and the lower layer UL.

Therefore, in the display device DSP according to the third modified example, the same effect as that of the display device DSP according to the embodiment described above is obtained. In addition, the width of the metal wiring MW12 of the display device DSP of the third modified example can be made smaller than the width of the metal wiring MW12 of the display device DSP of the embodiment, the first modified example, and the second modified example.

Fourth Modified Example

The display device DSP of the fourth modified example differs from the display device DSP of the embodiment and modified example described above in a configuration of the bank 1212.

FIG. 8 is a cross-sectional view illustrating a configuration example of the display device DSP according to the fourth modified example. FIG. 8 illustrates only the main part of the display device DSP.

The display device DSP includes the base 10, the insulation layer 11, the lower electrode E1 (E11 and E12), the metal wiring MW (MW12), the insulation layer 12 (1212), the organic layer OR (OR1, OR2, and OR3), and the upper electrode E2 (E21, E22, and E23).

In the example illustrated in FIG. 8, the end portion Eg11 of the lower electrode E11 and the end portion Eg22 of the lower electrode E12 are disposed with a gap (or spacing) GP4 in the first direction X. The gap GP4 may be the same as the gap GP1, may be greater than the gap GP1, or may be smaller than the gap GP1.

In the example illustrated in FIG. 8, the metal wiring MW12 has a width W5. The width W5 may be the same as the width W1 or the width W4, may be greater than the width W1 or the width W4, or may be smaller than the width W1 or the width W4. The metal wiring MW12 is disposed at a center portion of the gap GP4 between the lower electrodes E11 and E12 in the first direction X. The metal wiring MW12 is separated from the end portion Eg11 of the lower electrode E11 by a gap GP5 in the first direction X, and is separated from the end portion Eg22 of the lower electrode E12 by the gap GP5 in the first direction X. The gap GP5 may be the same as the gap GP2 or the gap GP3, may be greater than the gap GP2 or the gap GP3, or may be smaller than the gap GP2 or the gap GP3. The metal wiring MW12 may be disposed to be separated from the center portion of the gap GP4 between the lower electrodes E11 and E12. The metal wiring MW12 may be separated from each of the end portion Eg11 of the lower electrode E11 and the end portion Eg22 of the lower electrode 512 by a different gap.

In the example illustrated in FIG. 8, the bank 1212 has a trench (hollow or recess portion) T12 and a surface SF (SF1 and SF2). The trench T12 is disposed between the lower electrode E11 and the lower electrode E12. For example, the trench T12 does not overlap the lower electrodes E1 (E11 and E12). The trench T12 overlaps the metal wiring MW12. The surface SF has the surface SF1 and the surface SF2. The surface SF1 is located between the trench T12 and the opening portion OP1. The surface SF2 is located between the trench T12 and the opening portion OP2. The insulation layer 12 has the thickness TH1.

The trench T12 has a bottom surface (bottom portion) BS and a side surface SS (SS1 and SS2) rising from the bottom surface BS. In the example illustrated in FIG. 8, the side surface SS has the side surface SS1 and the side surface SS2. The side surface SS1 and the side surface SS2 are opposed to each other at a distance in the first direction X. The side surface SS1 is connected to the surface SF1. The side surface SS2 is connected to the surface SF2. The trench T12 corresponds to a space surrounded by the side surface SS1, the side surface SS2, and the bottom surface BS. The trench T12 has a depth DP. The depth DP is, for example, 0.5 µm to 1.0 µm.

The trench T12 has a gap (or spacing) GP6 between the side surface SS1 and the side surface SS2 in an upper portion UP, and a gap (or spacing) GP7 between the side surface SS1 and the side surface SS2 in the bottom surface BS. The gap GP6 is smaller than the gap GP7. That is, the trench T12 is formed so that the width along the first direction X is smaller as being directed from the bottom surface BS toward the upper portion UP. In other words, the side surface SS1 is inclined with respect to a normal direction of the bottom surface BS so as to overlap the bottom surface BS. Similarly, the side surface SS2 is inclined with respect to a normal direction of the bottom surface BS so as to overlap the bottom surface BS. The gap GP6 is, for example, greater than the width W5. The gap GP6 may be the same as the width W5 or may be smaller than the width W5.

In the example illustrated in FIG. 8, the organic layer OR1 covers the lower electrode E11 located at the opening portion OP1 and the surface SF1. The organic layer OR2 covers the lower electrode E12 located at the opening portion OP2 and the surface SF2. The organic layer OR3 is disposed in the trench T12. The organic layer OR3 is disposed on the bottom surface BS of the trench T12. The organic layer OR3 is separated from the organic layer OR1 and the organic layer OR2. Another layer may be disposed between the organic layer OR3 and the bottom surface BS.

In the example illustrated in FIG. 8, the upper electrode E2 includes the upper electrodes E21 and E22. The upper electrode E21 is disposed from the organic layer OR1 to the inside of the trench T12. The upper electrode E22 is disposed from the organic layer OR2 to the inside of the trench T12. The upper electrodes E21 and E22 are continuously disposed inside the trench T12. In other words, the upper electrode E21 and the upper electrode E22 are connected inside the trench T12. The upper electrode E2 (E21 and/or E22) covers, inside the trench T12, the organic layer OR3 and is in contact with the bottom surface BS. Inside the trench T12, the upper electrode E2 (E21 and/or E22) is in contact with the side surface SS1 and the side surface SS2. The upper electrode E2 (E21 and/or E22) overlapping (or opposed to) the metal wiring MW12 is separated from the metal wiring MW12 by a distance TH5. In other words, the upper electrode E2 (E21 and/or E22) located on the organic layer OR3 is separated from the metal wiring MW12 by the distance TH5. The distance TH5 is, for example, smaller than the distances TH3 and TH4. The distance TH5 may be equal to or smaller than the distance TH3 and equal to or greater than the distance TH4. The upper electrode E2 (E21 and/or E22) forms a capacitance Cs5 between the metal wiring MW12 and the upper electrode E2 via the insulation layer (bank) 1212 and the organic layer OR3. The capacitance Cs5 is greater than the capacitance Cs1. The capacitance Cs5 may be greater than the capacitance Cs4 or equal to or less than the capacitance Cs4. The capacitance Cs5 may be equal to or less than the capacitance Cs1.

In the example illustrated in FIG. 8, since the organic layer OR3 is disposed between the insulation layer 12 and the upper electrode E2 (E21 and/or E22) and is completely separated from the organic layer OR1 and the organic layer OR2, the organic layer OR3 does not emit the light or hardly emits the light. Since an area of the organic layer OR1 which covers the surface SF1 is located between the insulation layer 12 and the upper electrode E2, the area hardly emits the light. Similarly, since an area of the organic layer OR2 which covers the surface SF2 is located between the insulation layer 12 and the upper electrode E2, the area hardly emits the light.

The organic layer OR is formed, for example, by a vacuum deposition method. After forming the insulation layer 12 having the opening portion OP1, the opening portion OP2, and the trench T12, an organic material for forming the organic layer OR is vapor-deposited. Since the side surface SS1 is inclined so as to overlap the bottom surface BS, the organic layer OR is hardly formed or is not formed on the side surface SS1. Accordingly, the organic layer OR is formed so as to separate the organic layer OR1 from the organic layer OR3. Similarly, since the side surface SS2 is inclined so as to overlap the bottom surface BS, the organic layer OR is hardly formed or is not formed on the side surface SS2. Accordingly, the organic layer OR is formed so as to separate the organic layer OR2 from the organic layer OR3. In the bottom surface BS, the organic layer OR is hardly formed or is not formed in an area overlapping the side surface SS1 and side surface SS2 in the third direction Z. Since the upper electrode E2 is formed by sputtering, the upper electrode E2 is continuously formed on the organic layer OR, the bottom surface BS, the side surface SS1, and the side surface SS2.

Therefore, in the display device DSP according to the fourth modified example, the same effect as that of the display device DSP according to the embodiment described above is obtained. In addition, the capacity of the display device DSP of the fourth modified example can be more increased than that of the display device DSP of the embodiment and modified example described above.

Fifth Modified Example

The display device DSP of the fifth modified example is different from the display device DSP of the fourth modified example in that the auxiliary wiring CAW is provided.

Figure 9:
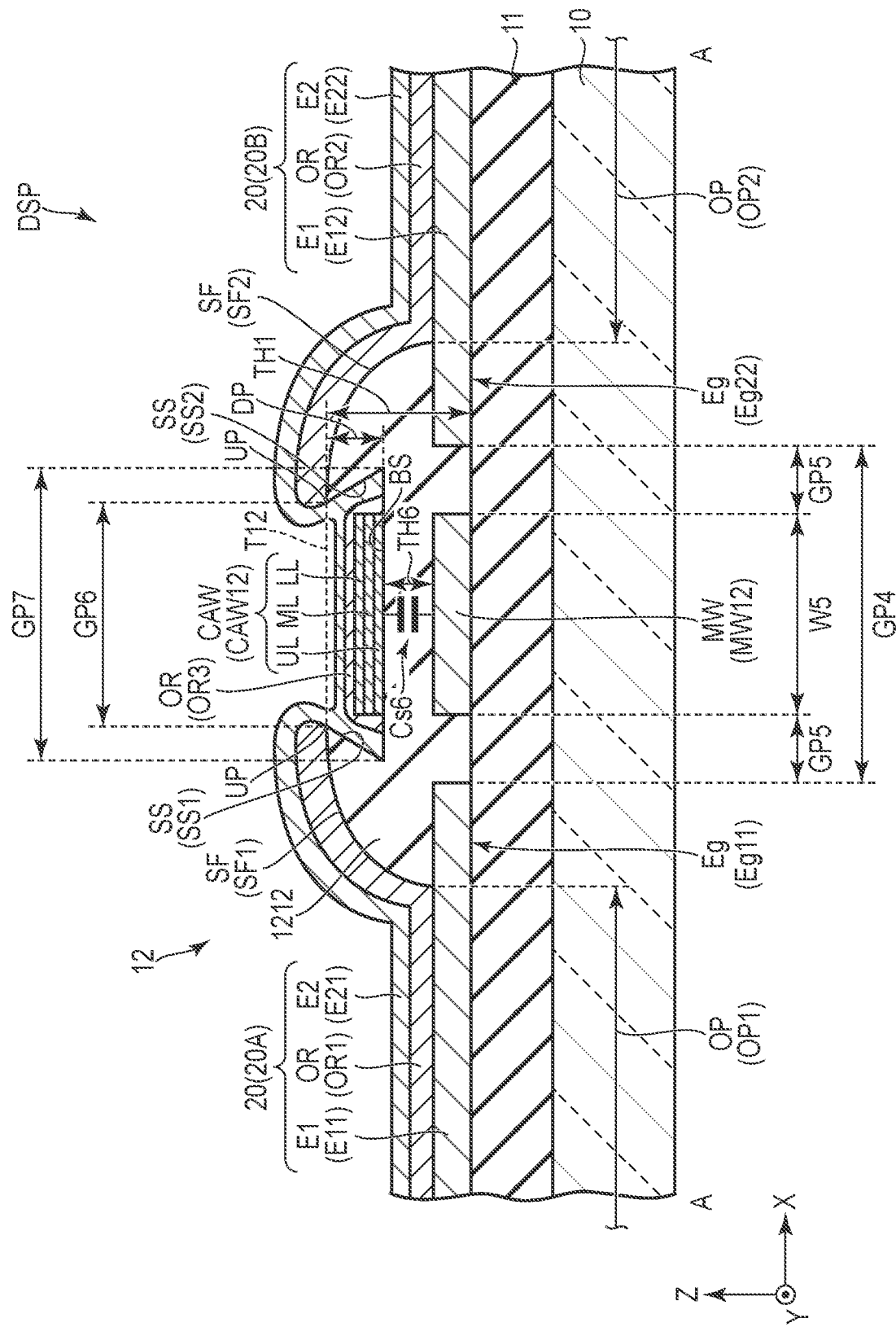
FIG. 9 is a cross-sectional view illustrating a configuration example of a display device according to a fifth modified example.

FIG. 9 is a cross-sectional view illustrating a configuration example of the display device DSP according to the fifth modified example. The display device DSP illustrated in FIG. 9 corresponds to the display device DSP illustrated in FIG. 8. FIG. 9 illustrates only the main part of the display device DSP.

In the example illustrated in FIG. 9, the auxiliary wiring CAW12 is located on the bottom surface BS of the trench T12. In other words, the lower layer UL of the auxiliary wiring CAW12 is located on the bottom surface BS of the trench T12. The width of the auxiliary wiring CAW12 is, for example, equal to or less than the gap GP6. The width of the auxiliary wiring CAW12 is, for example, the same as the width W5. For example, the width of the auxiliary wiring CAW12 may be greater than the width W5 or smaller than the width W5. For example, the thickness of the auxiliary wiring CAW12 is smaller than the depth DP of the trench T12. In other words, the depth DP of the trench T12 is greater than the thickness of the auxiliary wiring CAW12. In the example illustrated in FIG. 9, the lower layer UL of the auxiliary wiring CAW12 is separated from the metal wiring MW12 by a distance TH6. The distance TH6 is, for example, smaller than the distance TH5. The lower layer UL of the auxiliary wiring CAW12 forms a capacitance Cs6 between the metal wiring MW12 and the lower layer UL. For example, the capacitance Cs6 is greater than the capacitance Cs5. The capacitance Cs6 may be equal to or less than the capacitance Cs5. The organic layer OR3 covers the auxiliary wiring CAW12 in the trench, and a part of the organic layer OR3 is located on the bottom surface BS of the trench T12.

Therefore, in the display device DSP according to the fifth modified example, the same effect as that of the display device DSP according to the embodiment and modified example described above is obtained.

Sixth Modified Example

The display device DSP of the sixth modified example differs from the display device DSP of the embodiment described above in arrangement of the metal wiring MW.

Figure 10:
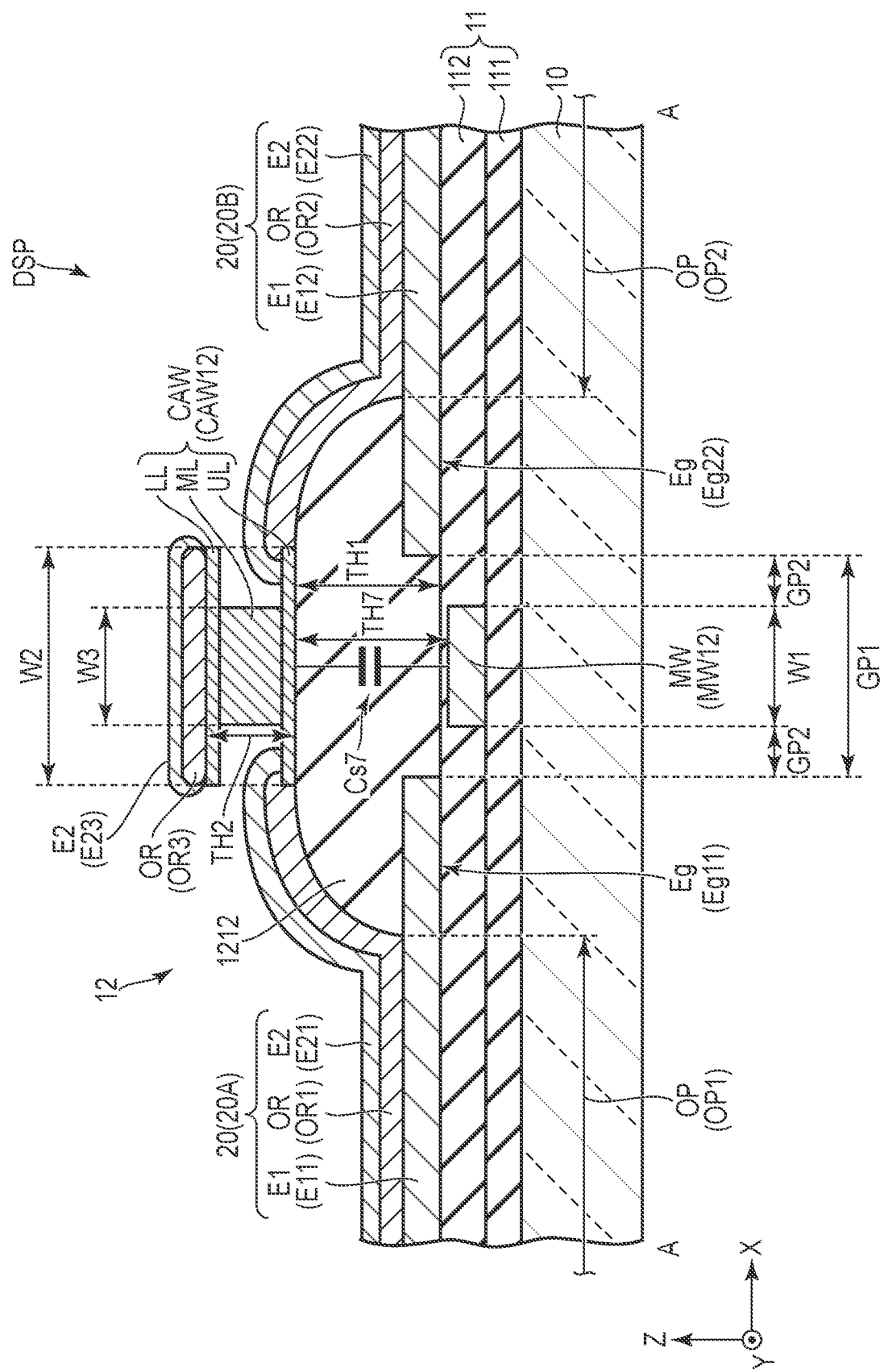
FIG. 10 is a cross-sectional view illustrating a configuration example of a display device according to a sixth modified example.

FIG. 10 is a cross-sectional view illustrating a configuration example of the display device DSP according to the sixth modified example. FIG. 10 illustrates only the main part of the display device DSP.

In the example illustrated in FIG. 10, the insulation layer 11 includes an insulation layer 111 and an insulation layer 112. The insulation layer 112 is disposed on the insulation layer 111. The insulation layer 112 corresponds to the underlayer of the display element 20. In the example illustrated in FIG. 10, the insulation layer 112 corresponds to the underlayer of the display elements 20A and 20B.

In the example illustrated in FIG. 10, the lower electrodes E11 and E11 are disposed on the insulation layer 112. In the example illustrated in FIG. 10, the metal wiring MW12 is disposed on the insulation layer 111 and covered by the insulation layer 112. In other words, the metal wiring MW12 is disposed between the insulation layers 111 and 112. The metal wiring MW12 is separated from the lower layer UL of the auxiliary wiring CAW12 by a distance TH7. The distance TH7 is greater than the distance TH3. The metal wiring MW12 forms a capacitance Cs7 between the Lower layer UL of the auxiliary wiring CAW12 and the metal wiring MW12. For example, the capacitance Cs7 is smaller than the capacitance Cs1. The metal wiring MW12 may be disposed on portion other than the portion between the insulation layers 111 and 112. For example, the metal wiring MW12 may be disposed between the base 10 and the insulation layer 11.

Therefore, in the display device DSP according to the sixth modified example, the same effect as that of the display device DSP according to the embodiment and modified example described above is obtained.

Seventh Modified Example

The display device DSP of the seventh modified example differs from the display device DSP of the embodiment and modified example described above in a configuration of the metal wiring MW.

Figure 11:
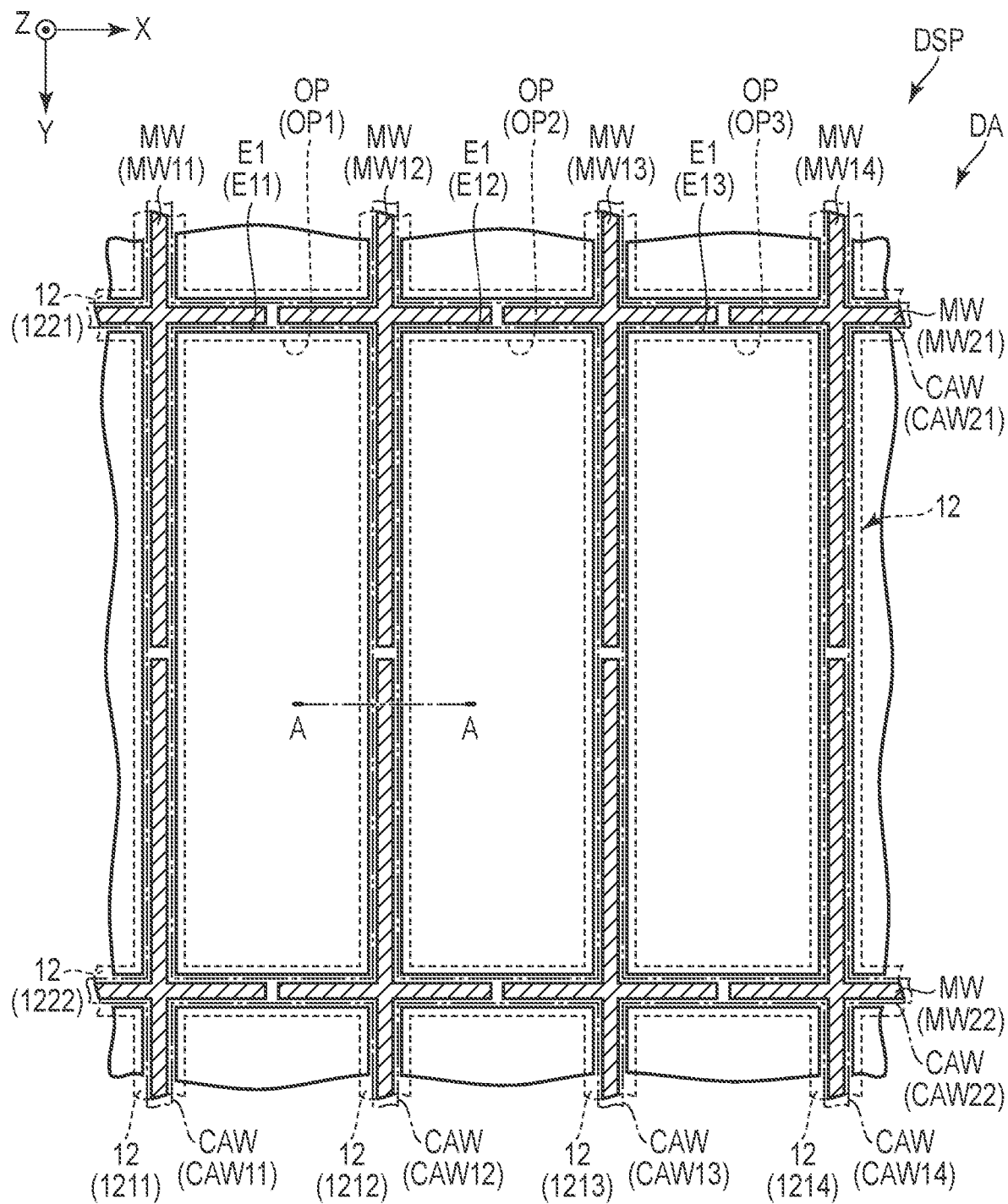
FIG. 11 is a plan view illustrating a configuration example of a metal wiring according to a seventh modified example.

FIG. 11 is a plan view illustrating a configuration example of the metal wiring MW according to the seventh modified example. The configuration illustrated in FIG. 7 corresponds to the configuration illustrated in FIG. 2. FIG. 11 illustrates only the configuration required for explanation.

In the example illustrated in FIG. 11, each of the metal wirings MW11 to MW14 and each of the metal wirings MW21 and MW22 are separated from each other. In other words, each of the metal wirings MW11 to MW14 and each of the metal wirings MW21 and MW22 include a plurality of metal wirings disposed at intervals.

Therefore, in the display device DSP according to the seventh modified example, the same effect as that of the display device DSP according to the embodiment and modified example described above is obtained.

Eighth Modified Example

The display device DSP of the eighth modified example differs from the display device DSP of the embodiment and modified example described above in a configuration of the pixel PX.

Figure 12:
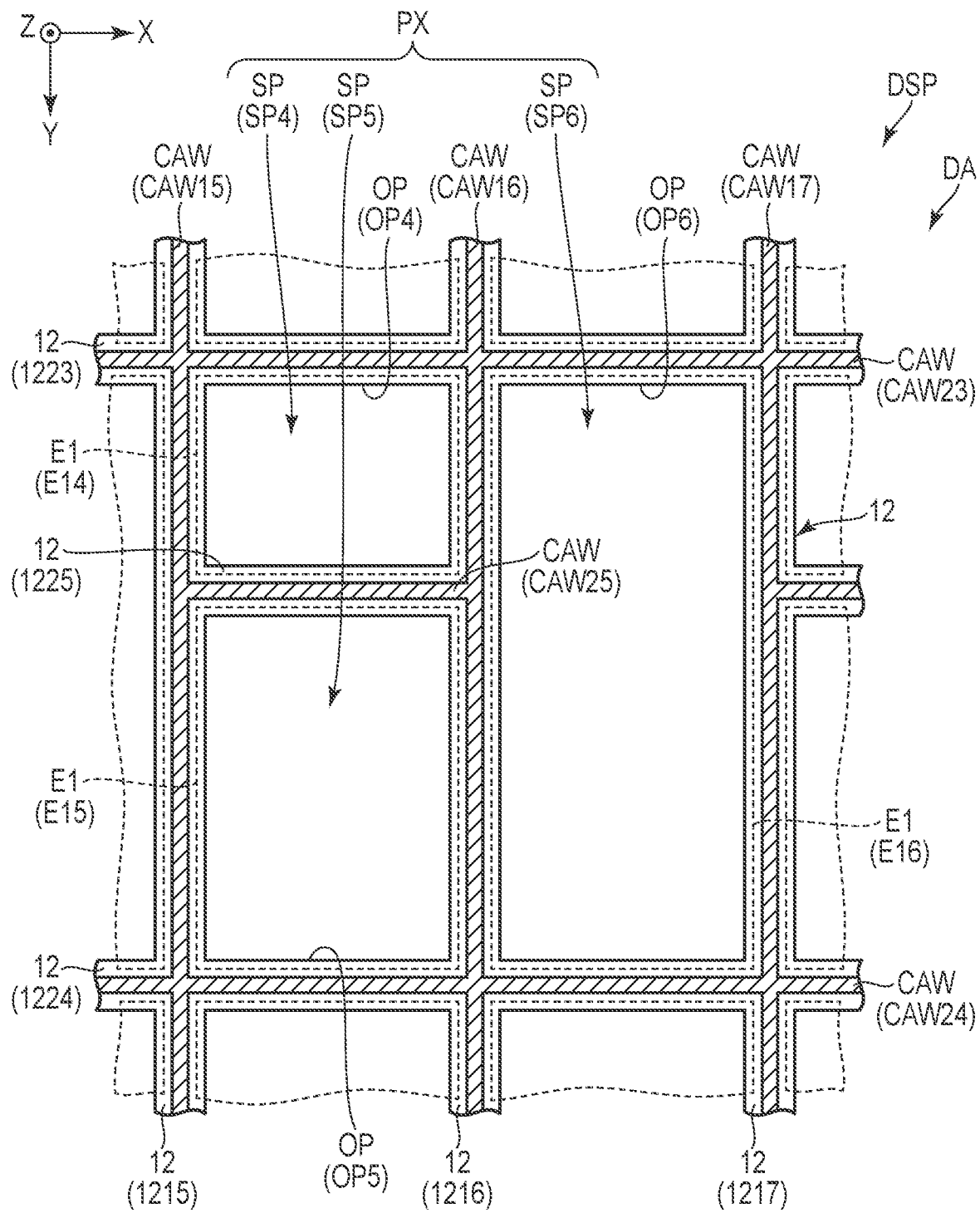
FIG. 12 is a plan view illustrating a configuration example of a pixel according to an eighth modified example.

FIG. 12 is a plan view illustrating a configuration example of the pixel PX according to the eighth modified example. FIG. 12 illustrates only the configuration required for explanation.

In the example illustrated in FIG. 12, the display device DSP includes a plurality of the pixels PX arranged in the first direction X and the second direction Y. Each of the pixels PX includes a plurality of sub-pixels SP4, SP5, and SP6. In one example, the pixel PX includes a red sub-pixel SP4, a green sub-pixel SP5, and a blue sub-pixel SP6.

In the example illustrated in FIG. 12, the display device DSP includes the insulation layer 12 (1215, 1216, 1217, 1223, 1224, and 1225), the lower electrode E1 (E14, E15, and E16), and the auxiliary wiring CAW (CAW15, CAW16, and CAW17).

In the example illustrated in FIG. 12, the lower electrode E1 includes the lower electrodes E14, E15, and E16. The lower electrode E14 is disposed in the sub-pixel SP4. The lower electrode E15 is disposed in the sub-pixel SP5. The lower electrode E16 is disposed on the sub-pixel SP6. The lower electrodes 514 and 515 are disposed in the second direction Y. The lower electrodes 514 and E15, and the lower electrode 516 are disposed in the first direction X.

In the example illustrated in FIG. 12, the insulation layer 12 includes insulation layers (banks) 1215, 1216, 1217,

1223, 1224, and 1225. The insulation layers 1215, 1216, and 1217 extend in the second direction Y. The insulation layers 1215 to 1217 are disposed at intervals in the first direction X. For example, the insulation layers 1215, 1216, and 1217 are disposed in the described order toward the distal end side of the arrow of the first direction X. The insulation layers 1223, 1224, and 1225 extend in the first direction X. The insulation layer 1225 is shorter than the insulation layers 1223 and 1224. For example, a length of the insulation layer 1225 corresponds to a distance between the insulation layers 1215 and 1216 in the first direction X. The insulation layers 1223 to 1225 are disposed at intervals in the second direction Y. For example, the insulation layers 1223, 1225, and 1224 are disposed in the described order toward the distal end side of the arrow of the second direction Y. The insulation layers 1215 to 1217, and the insulation layers 1223 and 1224 intersect with each other. The insulation layers 1215 and 1216, and the insulation layer 1225 intersect with each other.

In the example illustrated in FIG. 12, the insulation layer 12 includes an opening portion OP4 overlapping the lower electrode E14, an opening portion OP5 overlapping the lower electrode E15, and an opening portion OP6 overlapping the lower electrode E16. The opening portion OP4 corresponds to an area surrounded by the insulation layers 1215 and 1216, and the insulation layers 1223 and 1225. That is, a central portion of the lower electrode E14 overlapping the opening portion OP4 is exposed from the insulation layer 12. The opening portion OP5 corresponds to an area surrounded by the insulation layers 1215 and 1216, and the insulation layers 1225 and 1224. That is, a central portion of the lower electrode E15 overlapping the opening portion OP5 is exposed from the insulation layer 12. The opening portion OP6 corresponds to an area surrounded by the insulation layers 1216 and 1217, and the insulation layers 1223 and 1224. That is, a central portion of the lower electrode E16 overlapping the opening portion OP6 is exposed from the insulation layer 12.

In the example illustrated in FIG. 12, the insulation layer 1223 overlaps the end portion of the lower electrode E14 on a side opposite to the distal end side of the arrow of the second direction Y, and the end portion of the lower electrode E16 on a side opposite to the distal end side of the arrow of the second direction Y. The insulation layer 1224 overlaps the end portion of the lower electrode E15 on the distal end side of the arrow of the second direction Y, and the end portion of the lower electrode E16 on the distal end side of the arrow of the second direction Y. The insulation layer 1225 overlaps the end portion of the lower electrode E14 on the distal end side of the arrow of the second direction Y, and the end portion of the lower electrode Ely on a side opposite to the distal end side of the arrow of the second direction Y. The insulation layer 1215 overlaps the end portion of the lower electrode E14 on a side opposite to the distal end side of the arrow of the first direction X, and the end portion of the lower electrode E15 on a side opposite to the distal end side of the arrow of the first direction X. The insulation layer 1216 overlaps the end portion of the lower electrode E14 on the distal end side of the arrow of the first direction X, the end portion of the lower electrode E15 on the distal end side of the arrow of the first direction X, and the end portion of the lower electrode E16 on a side opposite to the distal end side of the arrow of the first direction X. The insulation layer 1217 overlaps the end portion of the lower electrode E16 on the distal end side of the arrow of the first direction X.

In the example illustrated in FIG. 12, the auxiliary wiring CAW includes the auxiliary wirings CAW15, CAW16, CAW17, CAW23, CAW24, and CAW25. The auxiliary wirings CAW15, CAW16, and CAW17 extend in the second direction Y. The auxiliary wirings CAW15 to CAW17 are disposed at intervals in the first direction X. For example, the auxiliary wirings CAW15, CAW16, and CAW17 are disposed in the described order toward the distal end side of the arrow of the first direction X. The auxiliary wirings CAW23, CAW24, and CAW25 extend in the first direction X. The auxiliary wiring CAW25 is shorter than the auxiliary wirings CAW23 and CAW24. For example, a length of the auxiliary wiring CAW25 corresponds to a distance between the auxiliary wiring CAW15 and the auxiliary wiring CAW16 in the first direction X. The auxiliary wirings CAW23 to CAW25 are disposed at intervals in the second direction Y. For example, the auxiliary wirings CAW23, CAW25, and CAW24 are disposed in the described order toward the distal end side of the arrow of the second direction Y. The auxiliary wirings CAW15 to CAW17 and the auxiliary wirings CAW23 and CAW24 intersect with each other. The auxiliary wirings CAW15 and CAW16 and the auxiliary wiring CAW25 intersect with each other.

The auxiliary wiring CAW15 overlaps the insulation layer 1215, the auxiliary wiring CAW16 overlaps the insulation layer 1216, and the auxiliary wiring CAW17 overlaps the insulation layer 1217. The auxiliary wiring CAW23 overlaps the insulation layer 1223, the auxiliary wiring CAW24 overlaps the insulation layer 1224, and the auxiliary wiring CAW25 overlaps the insulation layer 1225. The auxiliary wirings CAW15 to CAW17 and the auxiliary wirings CAW23 to CAW25 do not overlap the lower electrode E1.

Here, the sub-pixel SP4 is formed in a substantially rectangular shape extending in the first direction X, the sub-pixel SP5 is formed in a substantially rectangular shape extending in the second direction Y, and the sub-pixel SP6 is formed in a substantially rectangular shape extending in the second direction Y. A width of the sub-pixel SP4 in the first direction X is the same as a width of the sub-pixel SP5 in the first direction X. A width of the sub-pixel SP6 in the second direction Y is substantially the same as a width obtained by combining the width of the sub-pixel SP4 in the second direction Y and the width of the sub-pixel SP5 in the second direction Y. Areas of the sub-pixels SP4 to SP6 are different from each other. The area of the sub-pixel SP5 is larger than the area of the sub-pixel SP4, and the area of the sub-pixel SP6 is larger than the area of the sub-pixel SP5. The area of the sub-pixel SP5 may be the same as the area of the sub-pixel SP4.

Figure 13:
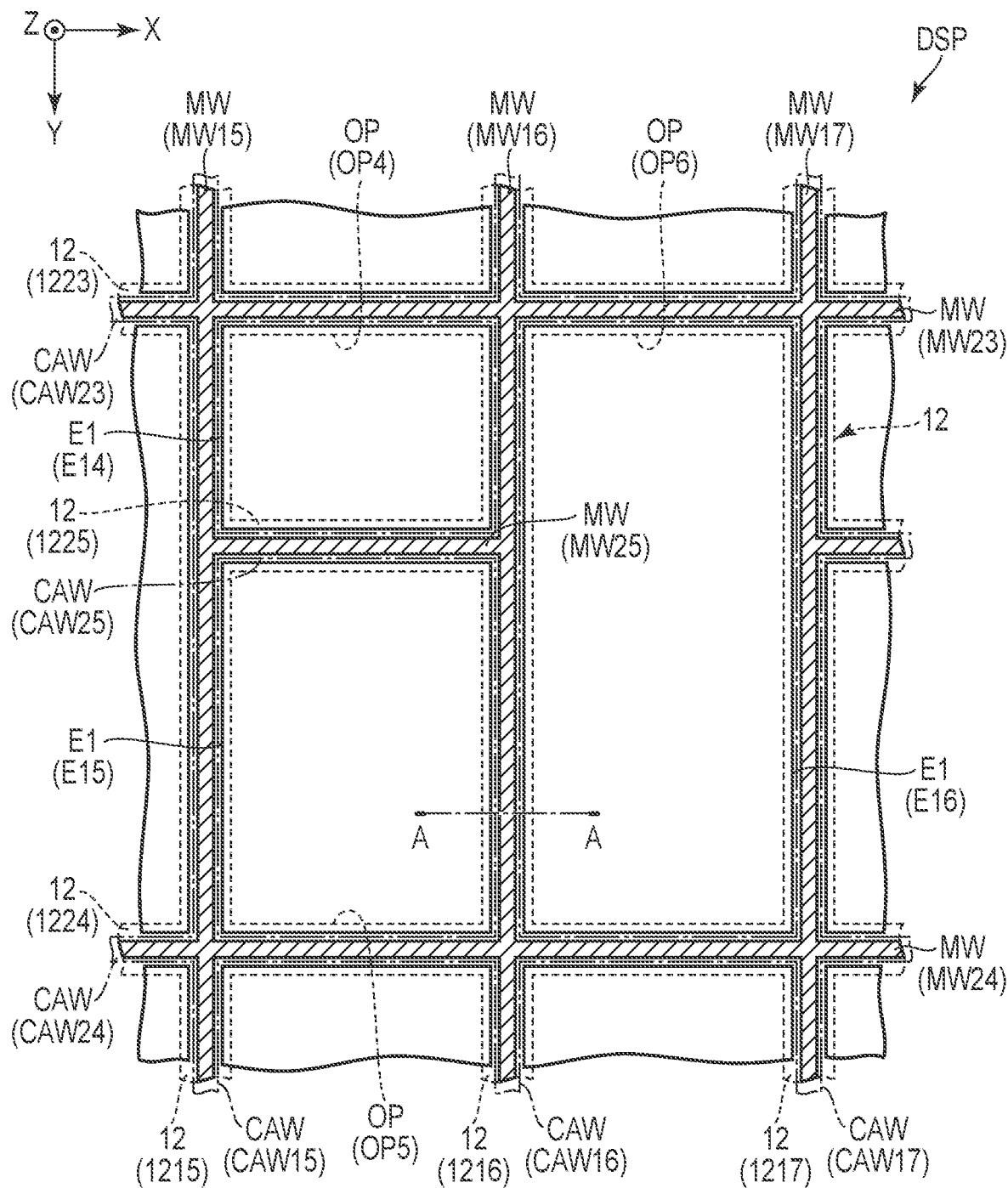
FIG. 13 is a plan view illustrating a configuration example of a metal wiring according to an eighth modified example.

FIG. 13 is a plan view illustrating a configuration example of the metal wiring MW according to the eighth modified example. The configuration illustrated in FIG. 13 corresponds to the configuration illustrated in FIG. 12. FIG. 13 illustrates only the configuration required for explanation.

In the example illustrated in FIG. 13, the display device DSP includes the insulation layer 12 (1215, 1216, 1217, 1223, and 1224), the lower electrode E1 (E14, E15, and E16), and the metal wiring MW (MW15, MW16, MW17, MW23, and MW24).

In the example illustrated in FIG. 13, the metal wiring MW includes the metal wirings MW15, MW16, MW17, MW23, MW24, and MW25. The metal wirings MW15, MW16, and MW17 extend in the second direction Y. The metal wirings MW15 to MW17 are disposed at intervals in the first direction X. For example, the metal wirings MW15, MW16, MW17, and MW18 are disposed in the described order toward the distal end side of the arrow of the first direction X. The metal wirings MW23, MW24, and MW25 extend in the first direction X. The metal wiring MW25 is shorter than the metal wirings MW23 and MW24. For example, a length of the metal wiring MW25 corresponds to a distance between the metal wiring MW15 and the metal wiring MW16 in the first direction X. The metal wirings MW23 to MW25 are disposed at intervals in the second direction Y. For example, the metal wirings MW23, MW25, and MW24 are disposed in the described order toward the distal end side of the arrow of the second direction Y. The metal wirings MW15 to MW17 and the metal wirings MW23 and MW24 intersect with each other. The metal wirings MW15 and MW16 and the metal wiring MW25 intersect with each other.

In the example illustrated in FIG. 13, the metal wiring MW15 overlaps the insulation layer 1215, the metal wiring MW16 overlaps the insulation layer 1216, and the metal wiring MW17 overlaps the insulation layer 1217. The metal wiring MW23 overlaps the insulation layer 1223, the metal wiring MW24 overlaps the insulation layer 1224, and the metal wiring MW25 overlaps the insulation layer 1225. The metal wirings MW15 to MW17, and the metal wirings MW23 to MW25 do not overlap the lower electrode E1.

In the example illustrated in FIG. 13, the metal wiring MW15 overlaps the auxiliary wiring CAW15, the metal wiring MW16 overlaps the auxiliary wiring CAW16, and the metal wiring MW17 overlaps the auxiliary wiring CAW17. The metal wiring MW23 overlaps the auxiliary wiring CAW23, the metal wiring MW24 overlaps the auxiliary wiring CAW24, and the metal wiring MW25 overlaps the auxiliary wiring CAW25.

Therefore, in the display device DSP according to the eighth modified example, the same effect as that of the display device DSP according to the embodiment and modified example described above is obtained.

Ninth Modified Example

The display device DSP of the ninth modified example differs from the display device DSP of the embodiment and modified example described above in a configuration of the pixel PX.

Figure 14:
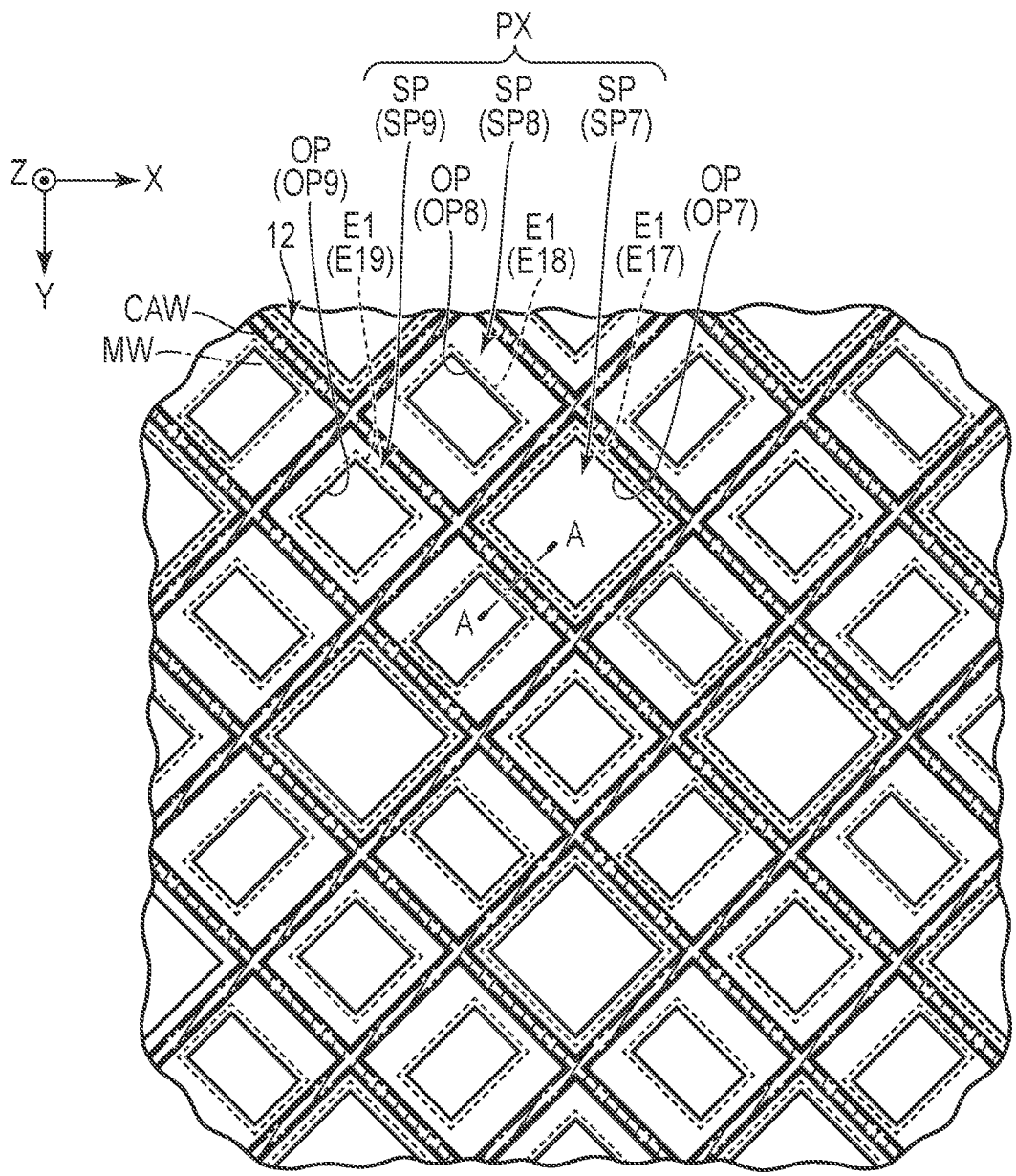
FIG. 14 is a plan view illustrating a configuration example of a pixel according to a ninth modified example.

FIG. 14 is a plan view illustrating a configuration example of the pixel PX according to the ninth modified example. FIG. 14 illustrates only the configuration required for explanation.

In the example illustrated in FIG. 14, the display device DSP includes a plurality of the pixels PX arranged in a diamond arrangement in the first direction X and the second direction Y. The pixel PX corresponds to, for example, a pentile pixel in which a sub-pixel SP is shared in a plurality of adjacent pixels PX. The pixel PX includes a plurality of sub-pixels SP7, SP8, and SP9. In one example, the pixel PX includes a blue sub-pixel SP7, a green sub-pixel SP8, and a red sub-pixel SP9.

In the example illustrated in FIG. 14, the display device DSP includes the insulation layer 12, the lower electrode E1 (E17, E18, and E19), the auxiliary wiring CAW, and the metal wiring MW.

In the example illustrated in FIG. 14, the lower electrode E1 includes the lower electrodes E17, E18, and E19. The lower electrode E11 is disposed on the sub-pixel SP7. The lower electrode E18 is disposed on the sub-pixel SP8. The lower electrode E19 is disposed on the sub-pixel SP9. The lower electrodes E17 to E19 are disposed in a triangular shape in a plan view. The lower electrode E11 is disposed on the distal end side of the arrow of the first direction X and the distal end side of the arrow of the second direction Y with respect to the lower electrode E18 in a plan view. The lower electrode E19 is disposed on a side opposite to the distal end side of the arrow of the first direction X and the distal end side of the arrow of the second direction Y with respect to the lower electrode E18 in a plan view. The shapes of the lower electrodes E11 to E19 are different. The shapes of two lower electrodes E1 among the lower electrodes E11 to E19 may be the same. The areas of the lower electrodes E11 to E19 are different. The areas of two lower electrodes E1 among the lower electrodes E11 to E19 may be the same.

In the example illustrated in FIG. 14, the insulation layer 12 is formed in an oblique lattice shape in a plan view. The insulation layer 12 includes an opening portion OP7 overlapping the lower electrode E17, an opening portion OP8 overlapping the lower electrode E18, and an opening portion OP9 overlapping the lower electrode E19. A central portion of the opening portion OP7 is exposed from the insulation layer 12. A central portion of the opening portion OP8 is exposed from the insulation layer 12. A central portion of the opening portion OP9 is exposed from the insulation layer 12.

In the example illustrated in FIG. 14, the auxiliary wiring CAW is disposed in an oblique lattice shape so as to overlap the insulation layer 12 in a plan view.

In the example illustrated in FIG. 14, the metal wiring MW is disposed in an oblique lattice shape so as to overlap the insulation layer 12 in a plan view. In other words, the metal wiring MW is disposed in an oblique lattice shape so as to overlap the auxiliary wiring CAW in a plan view.

Here, an outer shape of the sub-pixel SP7 corresponds to an outer shape of the lower electrode E17. For example, the outer shape of the sub-pixel SP7 is square. The outer shape of the sub-pixel SP7 may have a shape other than the square shape. An outer shape of the sub-pixel SP8 corresponds to an outer shape of the lower electrode E18. For example, the outer shape of the sub-pixel SP8 is rectangular. The outer shape of the sub-pixel SP8 may have a shape other than the rectangular shape. An outer shape of the sub-pixel SP9 corresponds to an outer shape of the lower electrode E19. For example, the outer shape of the sub-pixel SP9 is square. The outer shape of the sub-pixel SP9 may have a shape other than the square shape. An area of the sub-pixel SP7 is greater than areas of the sub-pixels SP8 and SP9. The area of the sub-pixel SP8 is equal to or smaller than the area of the sub-pixel SP9. The area of the sub-pixel SP8 may be greater than the area of the sub-pixel SP9.

Therefore, in the display device DSP according to the eighth modified example, the same effect as that of the display device DSP according to the embodiment and modified example described above is obtained.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A display device comprising:
a base;
a first insulation layer that is disposed on the base;
a first lower electrode that is disposed on the first insulation layer;

a second lower electrode that is disposed on the first insulation layer, separated from the first lower electrode, and formed of a same material as that of the first lower electrode;

a first wiring that is disposed between the first lower electrode and the second lower electrode;

a second insulation layer that is disposed on the first wiring;

a first organic layer that is disposed on the first lower electrode and includes a light emitting layer;

a second organic layer that is disposed on the second lower electrode and includes the light emitting layer;

a first upper electrode that is disposed on the first organic layer;

a second upper electrode that is disposed on the second organic layer;

a second wiring that is disposed on the second insulation layer, opposed to the first wiring, and forms a capacitance between the first wiring and the second wiring;

a third organic layer that is disposed on the second wiring, separated from the first organic layer and the second organic layer, and includes the light emitting layer; and a third upper electrode that is disposed on the third organic layer and separated from the first upper electrode and the second upper electrode.

2. The display device according to claim 1, wherein the first wiring is disposed on the first insulation layer.

3. The display device according to claim 1, wherein the first wiring, the first lower electrode, and the second lower electrode are formed of a same material.

4. The display device according to claim 1, wherein the first upper electrode and the second upper electrode are in contact with the second wiring.

5. The display device according to claim 1, wherein the second wiring is formed by a low resistance metal wiring.

6. The display device according to claim 1, wherein
a cross section of the second insulation layer is formed in a semicircular shape, and
the second wiring is disposed to be curved along a shape of the second insulation layer.

7. The display device according to claim 1, wherein
the second insulation layer includes a recess portion in a portion opposed to the first wiring, and
the second wiring is disposed in the recess portion.

8. The display device according to claim 1, wherein
a part of the first organic layer is disposed on the second insulation layer and is in contact with the second wiring, and
a part of the second organic layer is disposed on the second insulation layer and is in contact with the second wiring.

9. The display device according to claim 1, wherein the first wiring is formed of a transparent conductive material.

10. The display device according to claim 9, wherein the first wiring is formed of indium tin oxide or indium zinc oxide.

* * * * *